(12) United States Patent
Matsuzaki et al.

(10) Patent No.: US 12,501,776 B2
(45) Date of Patent: Dec. 16, 2025

(54) DISPLAY APPARATUS

(71) Applicant: SEMICONDUCTOR ENERGY LABORATORY CO., LTD., Atsugi (JP)

(72) Inventors: Takanori Matsuzaki, Kanagawa (JP); Tatsuya Onuki, Kanagawa (JP); Kiyoshi Kato, Kanagawa (JP); Yuki Okamoto, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/701,696

(22) PCT Filed: Oct. 17, 2022

(86) PCT No.: PCT/IB2022/059902
§ 371 (c)(1),
(2) Date: Apr. 16, 2024

(87) PCT Pub. No.: WO2023/073488
PCT Pub. Date: May 4, 2023

(65) Prior Publication Data
US 2025/0234706 A1 Jul. 17, 2025

(30) Foreign Application Priority Data

Oct. 27, 2021 (JP) ................. 2021-175475

(51) Int. Cl.
*H10K 59/121* (2023.01)
*G09G 3/3233* (2016.01)
(52) U.S. Cl.
CPC ....... *H10K 59/1213* (2023.02); *G09G 3/3233* (2013.01); *G09G 2300/0465* (2013.01); *G09G 2300/0842* (2013.01)

(58) Field of Classification Search
CPC .... H10K 59/1213; H10K 50/00; H10K 59/00; H10K 59/12; G09F 9/00; G09F 9/30;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001612192 A 5/2005
CN 105765662 A 7/2016
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Stacy Khoo
(74) *Attorney, Agent, or Firm* — Fish & Richardson P.C.

(57) ABSTRACT

A novel display apparatus is provided. The display apparatus includes a first layer and a second layer over the first layer. The first layer includes a functional circuit. The second layer includes a display unit including a plurality of pixels and a memory unit including a plurality of memory cells. Each of the plurality of pixels includes a pixel circuit and a light-emitting element over the pixel circuit. The functional circuit includes a display unit driver circuit and a control circuit. The memory unit has a function of storing image data that is to be output through the display unit driver circuit to the display unit. The memory cell includes a first transistor for retaining a potential corresponding to the image data, and a second transistor for reading the potential.

(Continued)

The first transistor is provided in the second layer, and the second transistor is provided in the first layer.

14 Claims, 24 Drawing Sheets

(58) Field of Classification Search
CPC .... G09G 3/20; G09G 3/3233; G09G 2360/12; G11C 11/405; H10B 12/00; H10B 41/70; H10D 30/67
See application file for complete search history.

(56) References Cited

U.S. PATENT DOCUMENTS

| | | | |
|---|---|---|---|
| 7,012,586 B2 | 3/2006 | Kageyama et al. |
| 7,990,369 B2 | 8/2011 | Sugita et al. |
| 9,859,016 B2 | 1/2018 | Katoh et al. |
| 9,905,657 B2 | 2/2018 | Endo et al. |
| 10,256,348 B2 | 4/2019 | Endo et al. |
| 11,793,010 B2 | 10/2023 | Yamazaki et al. |
| 2002/0072139 A1 | 6/2002 | Kashiwabara |
| 2002/0113546 A1 | 8/2002 | Seo et al. |
| 2004/0041761 A1 | 3/2004 | Sugita et al. |
| 2005/0088103 A1 | 4/2005 | Kageyama et al. |
| 2008/0197769 A1 | 8/2008 | Seo et al. |
| 2011/0089417 A1 | 4/2011 | Yamazaki et al. |
| 2011/0101351 A1 | 5/2011 | Yamazaki |
| 2011/0122670 A1 | 5/2011 | Yamazaki et al. |
| 2011/0148290 A1 | 6/2011 | Oota |
| 2012/0161220 A1 | 6/2012 | Yamazaki |
| 2012/0256204 A1 | 10/2012 | Yoshizumi et al. |
| 2012/0273804 A1 | 11/2012 | Hatano |
| 2012/0276484 A1 | 11/2012 | Izumi et al. |
| 2013/0084531 A1 | 4/2013 | Hamaguchi et al. |
| 2013/0084664 A1 | 4/2013 | Yoshitoku et al. |
| 2013/0084666 A1 | 4/2013 | Oshige |
| 2013/0221356 A1 | 8/2013 | Yamazaki et al. |
| 2013/0280839 A1 | 10/2013 | Sonoda et al. |
| 2013/0295705 A1 | 11/2013 | Sonoda et al. |
| 2014/0004640 A1 | 1/2014 | Hamaguchi et al. |
| 2014/0004642 A1 | 1/2014 | Otsuka et al. |
| 2015/0060826 A1 | 3/2015 | Matsumoto et al. |
| 2015/0069360 A1 | 3/2015 | Sato |
| 2015/0076476 A1 | 3/2015 | Odaka et al. |
| 2015/0255139 A1 | 9/2015 | Atsumi et al. |
| 2015/0340094 A1 | 11/2015 | Tamura |
| 2016/0172595 A1 | 6/2016 | Malinowski et al. |
| 2016/0315133 A1 | 10/2016 | Sato |
| 2016/0379719 A1 | 12/2016 | Katoh et al. |
| 2017/0040424 A1 | 2/2017 | Tanaka et al. |
| 2017/0141167 A1 | 5/2017 | Naganuma |
| 2017/0162603 A1 | 6/2017 | Yamazaki et al. |
| 2017/0207347 A1 | 7/2017 | Endo et al. |
| 2017/0256754 A1 | 9/2017 | Defranco et al. |
| 2017/0271338 A1 | 9/2017 | Yamazaki et al. |
| 2017/0309752 A1 | 10/2017 | Yamazaki et al. |
| 2018/0190908 A1 | 7/2018 | Ke et al. |
| 2019/0027493 A1 | 1/2019 | Kimura et al. |
| 2019/0259761 A1 | 8/2019 | Takemura et al. |
| 2020/0006328 A1 | 1/2020 | Yamazaki et al. |
| 2020/0126991 A1 | 4/2020 | Yamazaki et al. |
| 2020/0142773 A1 | 5/2020 | Yoneda et al. |
| 2020/0203345 A1 | 6/2020 | Matsuzaki et al. |
| 2020/0203662 A1 | 6/2020 | Mollard et al. |
| 2020/0265887 A1 | 8/2020 | Atsumi et al. |
| 2020/0320908 A1* | 10/2020 | Kim ................. G09G 3/035 |
| 2020/0342928 A1 | 10/2020 | Yamazaki et al. |
| 2020/0373302 A1 | 11/2020 | Onuki et al. |
| 2021/0012816 A1 | 1/2021 | Atsumi et al. |
| 2021/0104608 A1 | 4/2021 | Yamazaki |
| 2021/0125988 A1 | 4/2021 | Yamazaki et al. |
| 2021/0159252 A1 | 5/2021 | Okamoto et al. |
| 2021/0159435 A1 | 5/2021 | Yamazaki et al. |
| 2021/0174857 A1 | 6/2021 | Yamazaki et al. |
| 2022/0085020 A1 | 3/2022 | Nagatsuka et al. |
| 2022/0103772 A1 | 3/2022 | Yamazaki et al. |
| 2022/0190270 A1 | 6/2022 | Onoya et al. |
| 2022/0254402 A1 | 8/2022 | Yakubo et al. |
| 2022/0262438 A1 | 8/2022 | Yamazaki et al. |
| 2022/0262953 A1 | 8/2022 | Kozuma et al. |
| 2022/0392925 A1 | 12/2022 | Ishizu et al. |
| 2023/0403876 A1 | 12/2023 | Yamazaki et al. |

FOREIGN PATENT DOCUMENTS

| | | | |
|---|---|---|---|
| CN | 109215556 A | * | 1/2019 |
| CN | 112219233 A | | 1/2021 |
| JP | 09-329807 A | | 12/1997 |
| JP | 2000-036385 A | | 2/2000 |
| JP | 2002-324673 A | | 11/2002 |
| JP | 2003-059663 A | | 2/2003 |
| JP | 2004-070186 A | | 3/2004 |
| JP | 2005-134435 A | | 5/2005 |
| JP | 2008-098106 A | | 4/2008 |
| JP | 2008-147072 A | | 6/2008 |
| JP | 2008-251270 A | | 10/2008 |
| JP | 2013-225620 A | | 10/2013 |
| JP | 2014-120218 A | | 6/2014 |
| JP | 2014-135251 A | | 7/2014 |
| JP | 2014-232568 A | | 12/2014 |
| JP | 2015-115178 A | | 6/2015 |
| JP | 2016-197494 A | | 11/2016 |
| JP | 2017-130661 A | | 7/2017 |
| JP | 2019-179696 A | | 10/2019 |
| JP | 2020-160305 A | | 10/2020 |
| KR | 2004-0014349 A | | 2/2004 |
| KR | 2005-0040679 A | | 5/2005 |
| KR | 2021-0018225 A | | 2/2021 |
| TW | 200402675 | | 2/2004 |
| TW | 200515333 | | 5/2005 |
| TW | 202001856 | | 1/2020 |
| WO | WO-2015/075985 | | 5/2015 |
| WO | WO-2019/234543 | | 12/2019 |
| WO | WO-2019234543 A1 * | 12/2019 | ............... G02B 5/20 |
| WO | WO-2022188010 A1 * | 9/2022 | |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 :

(56) References Cited

OTHER PUBLICATIONS

SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.
International Search Report (Application No. PCT/IB2022/059902) Dated Dec. 20, 2022.
Written Opinion (Application No. PCT/IB2022/059902) Dated Dec. 20, 2022.

* cited by examiner

FIG. 10A
FIG. 10B
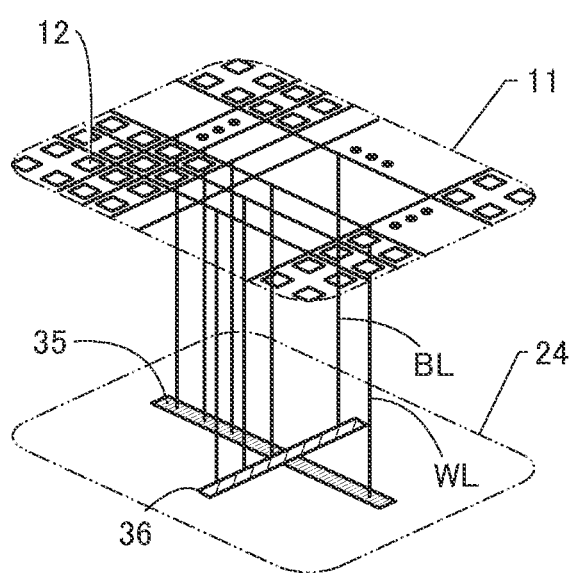
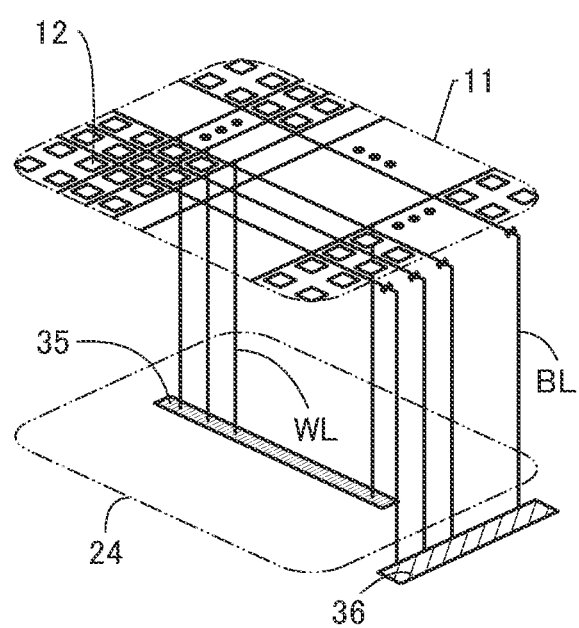

DISPLAY APPARATUS

CROSS REFERENCE TO RELATED APPLICATIONS

This application is a U.S. National Phase Application under 35 U.S.C. § 371 of International Application PCT/IB2022/059902, filed on Oct. 17, 2022, which is incorporated by reference and claims the benefit of a foreign priority application filed in Japan on Oct. 27, 2021, as Application No. 2021-175475.

TECHNICAL FIELD

One embodiment of the present invention relates to a display apparatus.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof.

BACKGROUND ART

In recent years, higher resolution of display apparatuses has been desired. For example, devices for virtual reality (VR), augmented reality (AR), substitutional reality (SR), or mixed reality (MR) are given as devices requiring high-resolution display apparatuses and have been actively developed in recent years. Display apparatuses used for these devices are required to be downsized as well as to increase resolution.

VR, AR, SR, and MR are collectively referred to as xR. Examples of a display apparatus for xR include a liquid crystal display apparatus and a light-emitting device including a light-emitting element such as an organic EL (Electro Luminescence) element or a light-emitting diode (LED).

For example, the basic structure of an organic EL element is a structure in which a layer containing a light-emitting organic compound is provided between a pair of electrodes. By applying voltage to this element, light emission can be obtained from the light-emitting organic compound. A display apparatus using such an organic EL element does not need a backlight that is necessary for a liquid crystal display device and the like; thus, a thin, lightweight, high-contrast, and low-power display apparatus can be achieved. Patent Document 1, for example, discloses an example of a display apparatus using an organic EL element.

REFERENCE

Patent Document

[Patent Document 1] Japanese Published Patent Application No. 2002-324673

SUMMARY OF THE INVENTION

Problems to be Solved by the Invention

For display apparatuses for xR, reduction in size, low power consumption, and multifunction are required.

An object of one embodiment of the present invention is to provide a downsized display apparatus. Another object of one embodiment of the present invention is to provide a display apparatus in which high color reproducibility is achieved. Another object of one embodiment of the present invention is to provide a high-resolution display apparatus. Another object of one embodiment of the present invention is to provide a display apparatus with high emission luminance. Another object of one embodiment of the present invention is to provide a highly reliable display apparatus. Another object of one embodiment of the present invention is to provide a novel display apparatus.

Note that the description of these objects does not preclude the existence of other objects. One embodiment of the present invention does not have to achieve all of these objects. Note that objects other than these can be derived from the description of the specification, the drawings, the claims, and the like.

Means for Solving the Problems

One embodiment of the present invention is a display apparatus including a first layer and a second layer over the first layer. The first layer includes a functional circuit, and the second layer includes a display unit including a plurality of pixels and a memory unit including a plurality of memory cells. Each of the plurality of pixels includes a pixel circuit and a light-emitting element over the pixel circuit, the functional circuit includes a display unit driver circuit, and the memory unit has a function of storing image data that is to be output through the display unit driver circuit to the display unit.

In one embodiment of the present invention, a display apparatus with the memory cells being provided in a region where the pixel circuit is provided is preferable.

In one embodiment of the present invention, a display apparatus with the memory cells being provided in at least part of a region of a peripheral portion of the display unit is preferable.

In one embodiment of the present invention, a display apparatus is preferable in which the memory cell includes a first transistor for retaining a potential corresponding to the image data and a second transistor for reading the potential, the first transistor is provided in the second layer, and the second transistor is provided in the first layer.

In one embodiment of the present invention, a display apparatus is preferable in which a semiconductor layer with a channel formation region of the first transistor includes a metal oxide, and a semiconductor layer with a channel formation region of the second transistor includes silicon.

In one embodiment of the present invention, a display apparatus in which the display unit driver circuit is provided in a region overlapping with the display unit is preferable.

In one embodiment of the present invention, a display apparatus in which the functional circuit includes a control circuit, a sensor circuit, a communication circuit, and an input/output circuit is preferable.

In one embodiment of the present invention, a display apparatus is preferable in which the display unit includes a plurality of sub-display units, each of the sub-display units includes the display unit driver circuit, and the number of times of image rewriting of image data per unit time in any one of the sub-display units is smaller than the number of times of image rewriting of image data per unit time in another sub-display unit.

One embodiment of the present invention in a display apparatus including a first layer, a second layer over the first layer, and a third layer over the second layer. The first layer includes a functional circuit, the second layer includes a display unit including a plurality of pixels, and the third layer includes a memory unit including a plurality of memory cells. Each of the plurality of pixels includes a pixel circuit and a light-emitting element over the pixel circuit. The functional circuit includes a display unit driver circuit. The memory unit has a function of storing image data that is to be output through the display unit driver circuit to the display unit.

In one embodiment of the present invention, a display apparatus is preferable in which the memory cell includes a first transistor for retaining a potential corresponding to the image data and a second transistor for reading the potential, the first transistor is provided in the third layer, and the second transistor is provided in the first layer.

In one embodiment of the present invention, a display apparatus is preferable in which a semiconductor layer with a channel formation region of the first transistor includes a metal oxide and a semiconductor layer with a channel formation region of the second transistor includes silicon.

In one embodiment of the present invention, a display apparatus in which the display unit driver circuit is provided in a region overlapping with the display unit is preferable.

In one embodiment of the present invention, a display apparatus is preferable in which the functional circuit comprises a control circuit, a sensor circuit, a communication circuit, and an input/output circuit.

One embodiment of the present invention is an electronic device including the above display apparatuses and a housing.

Note that other embodiments of the present invention are shown in the description of the following embodiments and the drawings.

Effect of the Invention

According to one embodiment of the present invention, a downsized display apparatus can be provided. Alternatively, a display apparatus which can achieve high color reproducibility can be provided. Alternatively, a high-resolution display apparatus can be provided. Alternatively, a display apparatus with high emission luminance can be provided. Alternatively, a highly reliable display apparatus can be provided. Alternatively, a novel display apparatus can be provided.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 10A and FIG. 10B are diagrams each illustrating a structure example of a display apparatus.

MODE FOR CARRYING OUT THE INVENTION

Figure 1A:
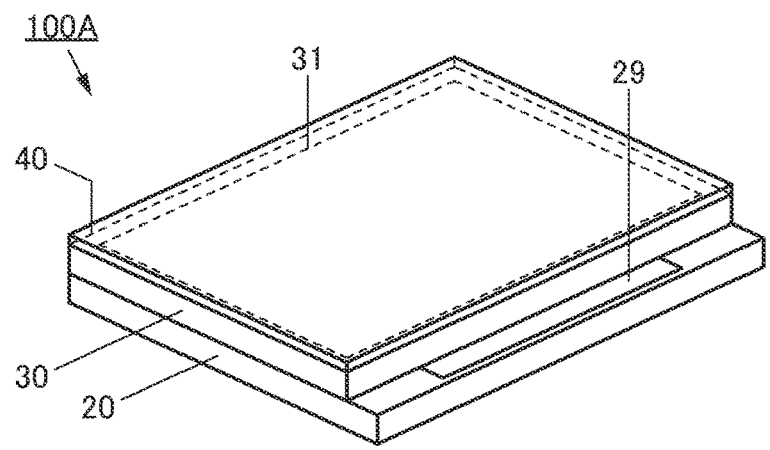
FIG. 1A and FIG. 1B are diagrams each illustrating a structure example of a display apparatus.

Hereinafter, embodiments will be described with reference to the drawings. However, the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In addition, in the drawings, the size, the layer thickness, or the region is exaggerated for clarity in some cases. Therefore, they are not limited to the illustrated scale. Note that drawings are schematic views of ideal examples, and the embodiments of the present invention are not limited to the shape or the value illustrated in the drawings.

Furthermore, unless otherwise specified, off-state current in this specification and the like refers to drain current of a transistor in an off state (also referred to as a non-conduction state or a cutoff state). Unless otherwise specified, an off state refers to, in an n-channel transistor, a state where voltage $V_{gs}$ between its gate and source is lower than the threshold voltage $V_{th}$ (in a p-channel transistor, higher than $V_{th}$).

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS transistor can also be called a transistor including a metal oxide or an oxide semiconductor.

Embodiment 1

A display apparatus of one embodiment of the present invention will be described.
<Structure Example 1 of Display Apparatus>

Figure 1B:
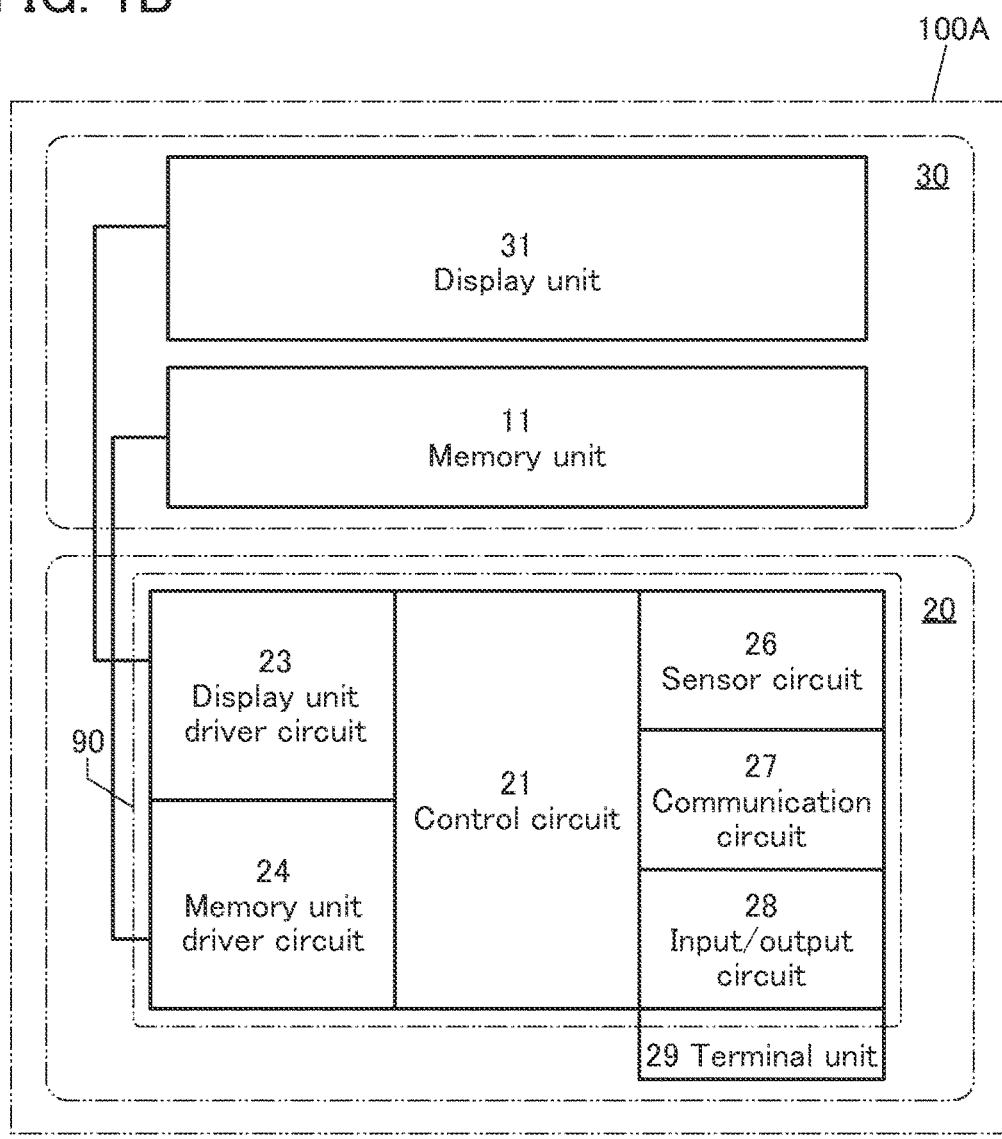
Figure 2:
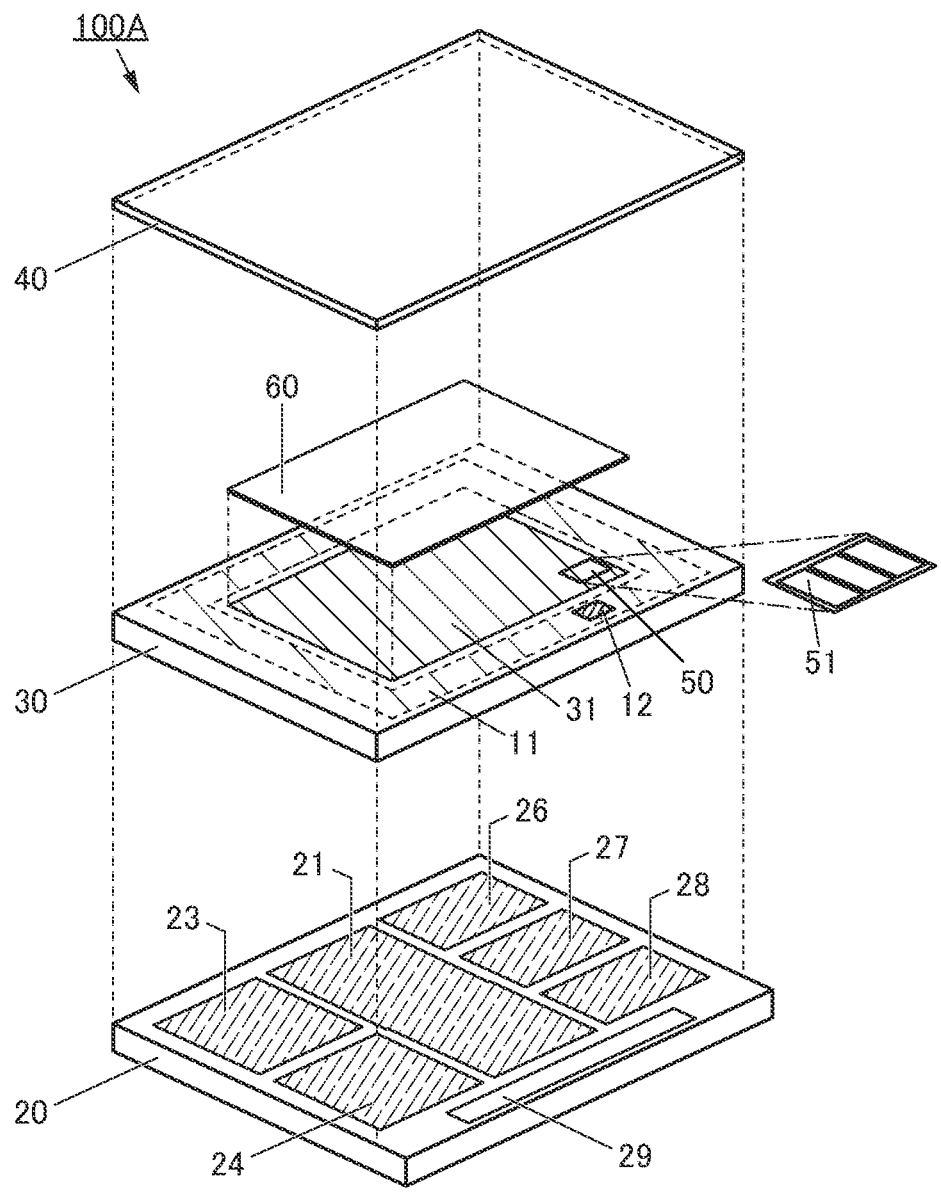
FIG. 2 is a diagram illustrating a structure example of a display apparatus.

FIG. 1A and FIG. 2 are perspective views of a display apparatus 100A of one embodiment of the present invention. FIG. 1B is a block diagram illustrating a structure of the display apparatus 100A. The display apparatus 100A includes a layer 30 over a layer 20, and a sealing substrate 40 over the layer 30. The layer 30 includes a memory unit 11 and a display unit 31, and a layer 60 is provided between the sealing substrate 40 and the display unit 31. A structure where the memory unit 11 is provided around a region with the display unit 31 on the layer 30 is illustrated as an example. For the structure of the display apparatus 100A to be easily understood, FIG. 2 shows the layer 20, the layer 30, the layer 60, the sealing substrate 40, and the like being spaced apart from one another.

The layer 20 includes a functional circuit 90 and a terminal unit 29. The functional circuit 90 includes a control circuit 21, a display unit driver circuit 23, a memory unit driver circuit 24, a sensor circuit 26, a communication circuit 27, and an input/output circuit 28.

Note that the functional circuit 90 does not have to include all of these structures, and may include another structure. For example, the functional circuit 90 may include a power supply circuit and/or a power management circuit for controlling power supply disruption. The functional circuit 90 may also include DSP (Digital Signal Processor) and/or FPGA (Field Programmable Gate Array), for example. The functional circuit 90 may also include a super-resolution circuit or the like, for example. The super-resolution circuit has a function of upconverting image data with a lower definition than that of the display unit. The super-resolution circuit also has a function of downconverting image data with a higher definition than that of the display unit.

The functional circuit 90 is preferably formed using a Si CMOS, i.e., a transistor containing silicon in a channel formation region (Si transistor). That is, the layer 20 including the functional circuit 90 is a layer including Si transistors. When the functional circuit 90 is formed using Si transistors, circuits having a function of the control circuit 21, the display unit driver circuit 23, the memory unit driver circuit 24, the sensor circuit 26, the communication circuit 27, and the input/output circuit 28 can be provided in the functional circuit 90.

It is preferable to use, for Si transistors, silicon with high crystallinity such as single crystal silicon or polycrystalline silicon because high field-effect mobility can be achieved and higher-speed operation can be performed.

The layer 30 is a layer including an OS transistor, i.e., a transistor including an oxide semiconductor in a channel formation region. With this structure, the memory unit 11 and the display unit 31 including OS transistors can be stacked over the layer 20.

An OS transistor has a characteristic of an extremely low off-state current. Thus, when an OS transistor is used as a transistor provided in a pixel circuit, in particular, analog data written to the pixel circuit or a memory cell can be retained for a long time.

A metal oxide used for an OS transistor is a Zn oxide, a Zn—Sn oxide, a Ga—Sn oxide, an In—Ga oxide, an In—Zn oxide, an In-M-Zn oxide (M is Ti, Ga, Y, Zr, La, Ce, Nd, Sn, or Hf), or the like. The use of a metal oxide containing Ga as M for the OS transistor is particularly preferable because the electrical characteristics such as field-effect mobility of the transistor can be made excellent by adjusting a ratio of elements. In addition, an oxide containing indium and zinc may contain one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

When the functional circuit 90 has a function of upconverting or downconverting image data, image processing that is performed in an external circuit can be performed in a display apparatus; thus, image processing can be shared between an external circuit and the functional circuit 90.

The control circuit 21 has a function of controlling the operation of the functional circuit 90 provided in the layer 20, on the basis of signals from a circuit that processes image data such as a CPU (Central Processing Unit) or a GPU (Graphics Processing Unit).

The display unit driver circuit 23 is electrically connected to the display unit 31 included in the layer 30 and has a function of supplying image data to the display unit 31. A variety of circuits such as a shift register, a level shifter, an inverter, a latch, an analog switch, and a logic circuit can be used as the display unit driver circuit 23. As illustrated in FIG. 2, the layer 60 is provided to overlap with the display unit 31 included in the layer 30. The layer 60 includes a plurality of light-emitting elements, and the emission luminance is controlled by a pixel circuit 51 provided in the display unit 31. Thus, the layer 60 can also be regarded as part of the display unit 31.

The display unit 31 includes a pixel 50 including a plurality of pixel circuits 51. The pixel 50 includes the pixel circuits 51 and light-emitting elements (not illustrated) provided in the layer 60 over the pixel circuits 51. The pixel circuit 51 corresponds to a pixel circuit included in a subpixel for performing color display. The details of the pixel circuits 51 and the light-emitting elements will be described later.

Note that the three sub-pixels each control the amount or the like of red light, green light, or blue light. Note that the light colors controlled by the three sub-pixels are not limited to a combination of red (R), green (G), and blue (B) and may be cyan (C), magenta (M), and yellow (Y). In addition, the three subpixels do not necessarily have the same area. In the case where luminous efficiency, reliability, or the like varies depending on an emission color, the subpixel area may be changed depending on the emission color. Four subpixels may collectively function as one pixel. For example, a sub-pixel that controls white light may be added to the three sub-pixels that control red light, green light, and blue light. The addition of the subpixel that controls white light can increase the luminance of a display region. Alternatively, a sub-pixel that controls yellow light may be added to the three sub-pixels that control red light, green light, and blue light. Alternatively, a sub-pixel that controls white light may be added to the three sub-pixels that control cyan light, magenta light, and yellow light.

When the number of subpixels functioning as one pixel is increased and subpixels that control light of red, green, blue, cyan, magenta, yellow, and the like are used in an appropriate combination, the reproducibility of halftones can be increased. Then, color reproducibility can be increased.

The memory unit driver circuit 24 is electrically connected to the memory unit 11 included in the layer 30, and has a function of writing and reading data to and out of the memory unit 11. A variety of circuits such as a word line driver circuit, a bit line driver circuit, and an analog-digital converter circuit can be used for the memory unit driver circuit 24.

The sensor circuit 26 has a function of obtaining information on one or more of the senses of sight, hearing, touch, taste, and smell of a human. Specifically, the sensor circuit 26 has at least one of functions of sensing or measuring force, displacement, position, speed, acceleration, angular velocity, rotational frequency, distance, light, magnetism, temperature, sound, time, electric field, current, voltage, electric power, radiation, humidity, gradient, oscillation, a smell, and infrared rays. The sensor circuit 26 may have a function other than these functions.

The communication circuit 27 has a wireless or wired communication function. In particular, the communication circuit 27 preferably has a wireless communication function, in which case the number of parts such as a connection cable can be decreased.

In the case where the communication circuit 27 has a wireless communication function, the communication circuit 27 can perform communication via an antenna. As a communication protocol or a communication technology, a communication standard such as LTE (Long Term Evolution), GSM (Global System for Mobile Communication: registered trademark), EDGE (Enhanced Data Rates for GSM Evolution), CDMA2000 (Code Division Multiple Access 2000), or W-CDMA (registered trademark), or an IEEE communication standard such as Wi-Fi (registered trademark), Bluetooth (registered trademark), or ZigBee (registered trademark) can be used.

The communication circuit 27 can perform input/output of information by connecting the display apparatus 100A to another device via a computer network such as the Internet, which is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network).

The input/output circuit 28 has a function of distributing signals supplied to the display apparatus 100A through the terminal unit 29 to circuits such as the control circuit 21. In addition, the input/output circuit 28 has a function of distributing signals supplied to the display apparatus 100A through the communication circuit 27 to the circuits such as the control circuit 21.

The input/output circuit 28 has a function of outputting signals to the outside through the terminal unit 29. The input/output circuit 28 has function of outputting signals to the outside through the communication circuit 27.

An FPC (Flexible printed circuits) or the like is electrically connected to the terminal unit 29. Thus, the layer 30 and the sealing substrate 40 are not formed in a region overlapping with the terminal unit 29.

The memory unit 11 includes a plurality of memory cells 12. The memory cell 12 functions as a memory element. As the memory unit 11, memory devices with a variety of memory methods can be used. For example, a DRAM (Dynamic Random Access Memory), an SRAM (Static Random Access Memory), a phase-change memory (PCM), a resistive random access memory (ReRAM), a magnetoresistive random access memory (MRAM), a ferroelectric random access memory (FeRAM), an antiferroelectric memory, or the like may be used.

A NOSRAM (Nonvolatile Oxide Semiconductor Random Access Memory) or a DOSRAM (Dynamic Oxide Semiconductor Random Access Memory) may be used for the memory unit 11.

"NOSRAM (registered trademark)" is an abbreviation for "Nonvolatile Oxide Semiconductor Random Access Memory (RAM)". A NOSRAM is a memory in which its memory cell is a 2-transistor (2T) or 3-transistor (3T) gain cell, and its access transistor is an OS transistor. An OS transistor has an extremely low current that flows between a source and a drain in an off state, that is, an extremely low leakage current. A NOSRAM is capable of reading retained data without destruction (non-destructive reading).

"DOSRAM (registered trademark)" is an abbreviation for "Dynamic Oxide Semiconductor RAM", which indicates a RAM including 1T (transistor) 1C (capacitor)-type memory cells. DOSRAM, as well as NOSRAM, is a memory utilizing a low off-state current of an OS transistor.

NOSRAM and DOSRAM are each one kind of memory devices using a transistor including an oxide semiconductor in a channel formation region (hereinafter also referred to as an "OS transistor").

The memory cell 12 included in the memory unit 11 and the pixel circuit 51 included in the display unit 31 each include an OS transistor. With this structure, the display unit 31 and the memory unit 11 can be placed in the layer 30. With the structure in which the memory unit 11 and the display unit 31 are provided in the same layer, the memory unit 11 can be provided utilizing a region of the layer 30 where the display unit 31 is not provided.

In the structure illustrated in FIG. 2, the memory unit 11 is provided around the region where the display unit 31 is provided. Note that the memory unit 11 may be provided in at least part of the region around the display unit 31. With this structure, the memory unit 11 can be placed to fill a region where the display unit 31 is not provided in the layer 30. Thus, the memory capacity can be increased by placing the memory unit 11 without impairing the display quality by, for example, decreasing the area of the display unit 31.

In the structure of one embodiment of the present invention, the memory unit 11 can be provided in the layer 30 where the display unit 31 is provided. Thus, the memory capacity of the display apparatus 100A can be increased. When the memory unit 11 stores image data input from an external circuit, the memory unit 11 can be used as a frame memory. The image data is image data output to the display unit 31 through the display unit driver circuit 23.

Figure 3A:
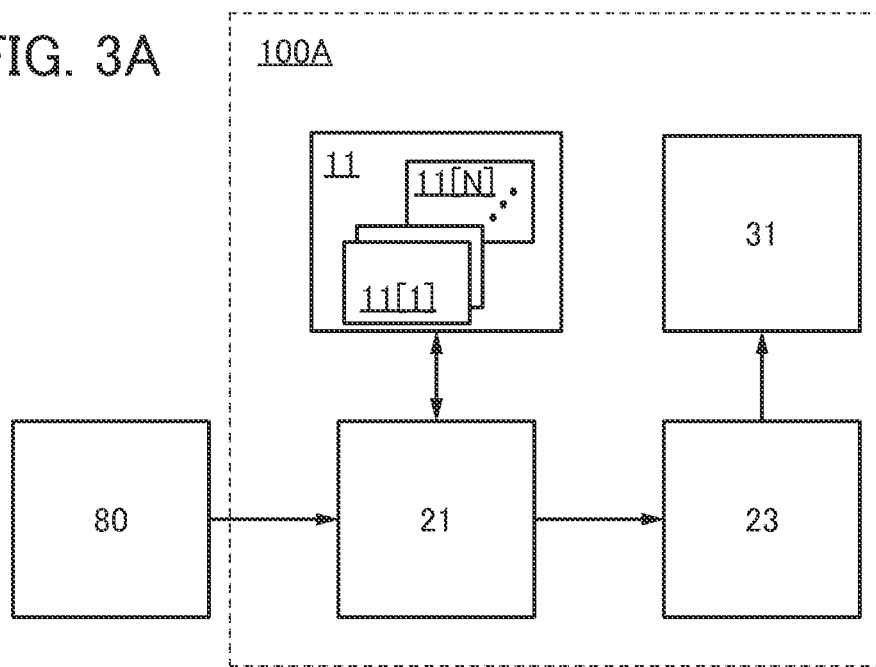
FIG. 3A and FIG. 3B are diagrams each illustrating a structure example of a display apparatus.

FIG. 3A is a block diagram illustrating a structure of the memory unit 11 that can be used as a frame memory. FIG. 3A illustrates an external circuit 80 that processes image data, such as a CPU or a GPU, the control circuit 21, the memory unit 11, the display unit driver circuit 23, and the display unit 31.

As described above, the structure of one embodiment of the present invention enables the memory capacity of the memory unit 11 to be increased, whereby a plurality of frame memories that retain image data for one frame can be provided. In FIG. 3A, a plurality of memory regions 11[1] to 11[N] (N is a natural number) are shown as frame memories.

As described above, the memory unit 11 includes a memory cell including an OS transistor, such as a NOSRAM or a DOSRAM. Thus, unlike a static RAM (SRAM) or the like which is formed using a Si transistor, it can also be placed in a layer different from the layer with the functional circuit 90 formed using a Si transistor. In addition, although an SRAM has a circuit configuration where six transistors are generally used as transistors that make up the memory cell, a NOSRAM has a circuit configuration where two or three transistors are used, has a circuit configuration where an OS transistor and a Si transistor are used in combination, and enables multilevel data to be stored. Thus, the capacity of data to be stored can be increased and image data for multiple frames can be retained. Furthermore, in the case where a memory cell using an OS transistor is used as a frame memory, it is no longer necessary to separately provide an IC chip that functions as a frame memory in the display apparatus, which can reduce the cost.

In this manner, with the memory unit 11 functioning as a frame memory required to have high capacity, the display apparatus of one embodiment of the present invention can retain image data for multiple frame periods. In this case, the amount of image data transfer from the external circuit 80 to the control circuit 21 can be reduced. Furthermore, the amount of image data transfer input to or output from the memory unit 11 through the control circuit 21 can be reduced.

Figure 3B:
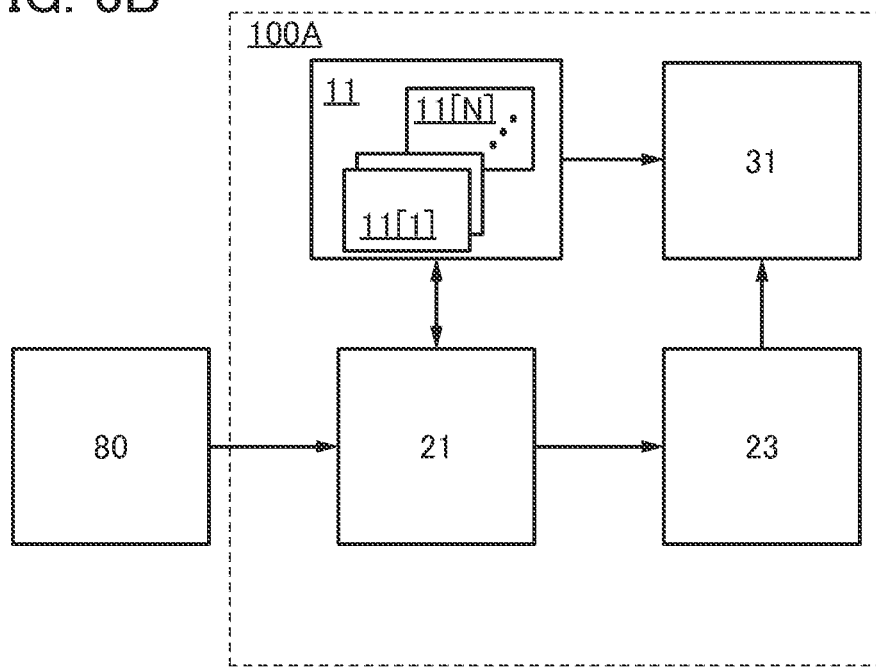

The memory cell using an OS transistor can retain an analog value. Thus, when the data to be retained in the memory cell is analog data supplied to the pixel circuit, image data can be directly supplied from the memory unit 11 to the display unit 31. An example of a block diagram in that case is illustrated in FIG. 3B.

With the memory unit 11 functioning as a frame memory that retains an analog value, as described above, it is possible to skip the process of converting image data in a digital value into image data in an analog value, which is performed in the display unit driver circuit 23. Thus, the circuit scale in the display unit driver circuit 23 can be reduced.

Figure 4:
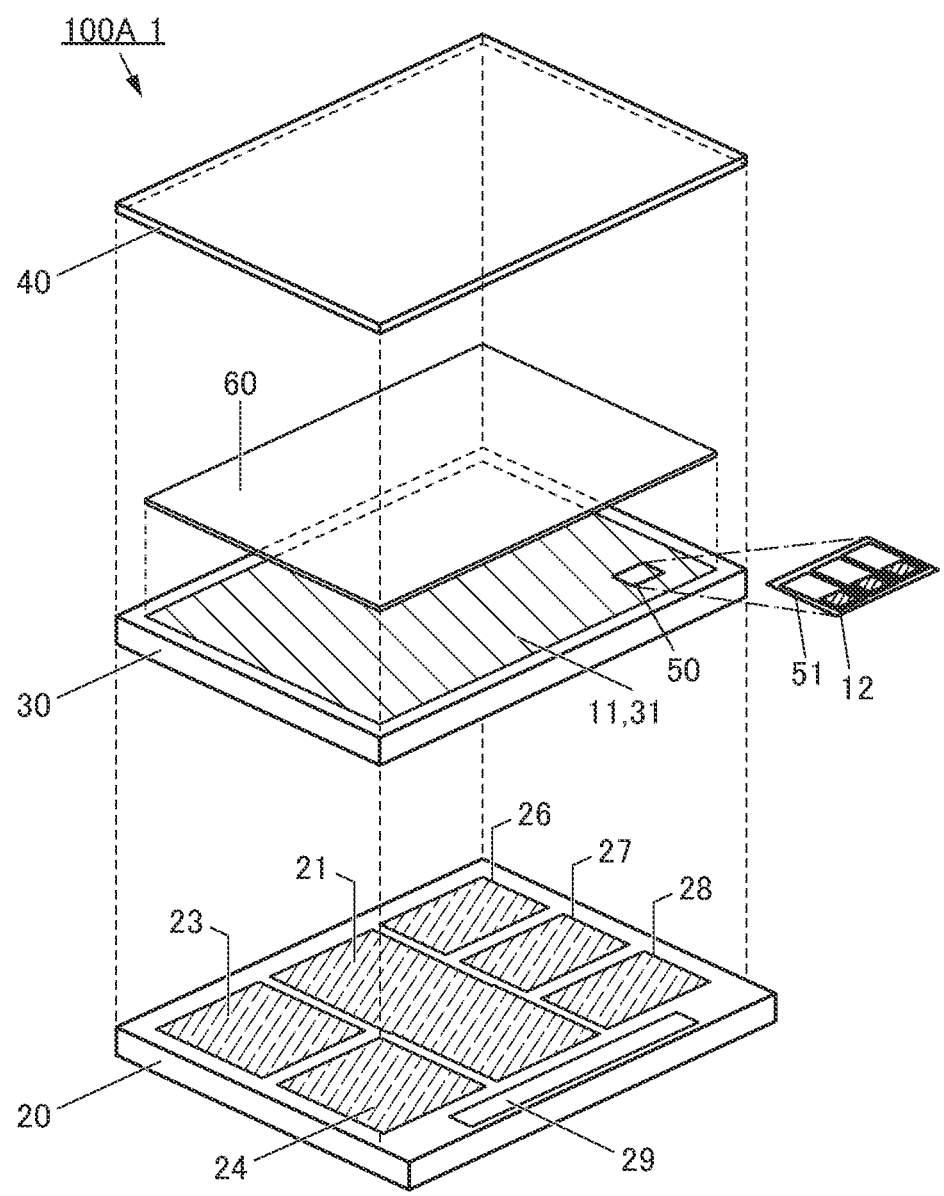
FIG. 4 is a diagram illustrating a structure example of a display apparatus.

In the case where the memory cell 12 included in the memory unit 11 retains an analog value and supplies it to the pixel circuit, the memory cell 12 may be provided in a region where the pixel circuit is provided. FIG. 4 illustrates a structure example of this case. A display apparatus 100A_1 illustrated in FIG. 4 has a structure in which the display unit 31 and the memory unit 11 are provided in the layer 30, and the memory cell 12 included in the memory unit 11 is provided in the pixel circuit 51 included in the pixel 50. With this structure, a so-called memory-in-pixel structure, with the memory cell formed using an OS transistor being provided in the pixel circuit, can be achieved. In this case, the capacity of the memory unit 11 functioning as a frame memory can be reduced.

<Structure Example of Display Unit Driver Circuit>

Figure 5A:
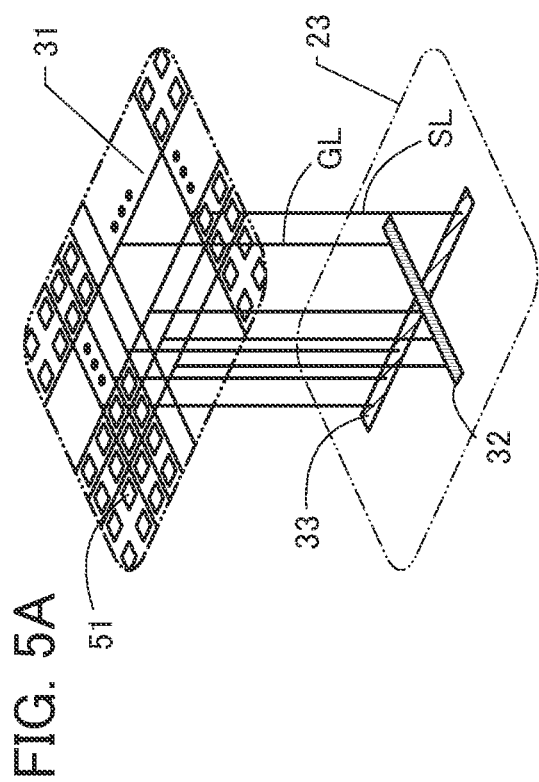
FIG. 5A and FIG. 5B are diagrams each illustrating a structure example of a display apparatus.

FIG. 5A is a schematic diagram illustrating a connection relation between the display unit driver circuit 23 and the display unit 31. As described above, in one embodiment of the present invention, the display unit driver circuit 23 and the display unit 31 are provided in different layers, which enables a structure where the display unit 31 is provided over the display unit driver circuit 23.

The display unit driver circuit 23 includes a first driver circuit 32 and a second driver circuit 33. A circuit included in the first driver circuit 32 functions as, for example, a scan line driver circuit (gate line driver circuit). A circuit included in the second driver circuit 33 functions as, for example, a signal line driver circuit (source line driver circuit). The first driver circuit 32 is electrically connected, through a wiring GL (gate line), to the pixel circuit 51 in the display unit 31 provided above. The second driver circuit 33 is electrically connected, through a wiring SL (source line), to the pixel circuit 51 in the display unit 31 provided above.

Note that the display unit driver circuit 23 is referred to as a "peripheral driver circuit" in some cases. Any of various circuits such as a shift register, a level shifter, an inverter, a latch, an analog switch, and a logic circuit can be used as the peripheral driver circuit. In the peripheral driver circuit, a transistor, a capacitor, and the like can be used.

Figure 5B:
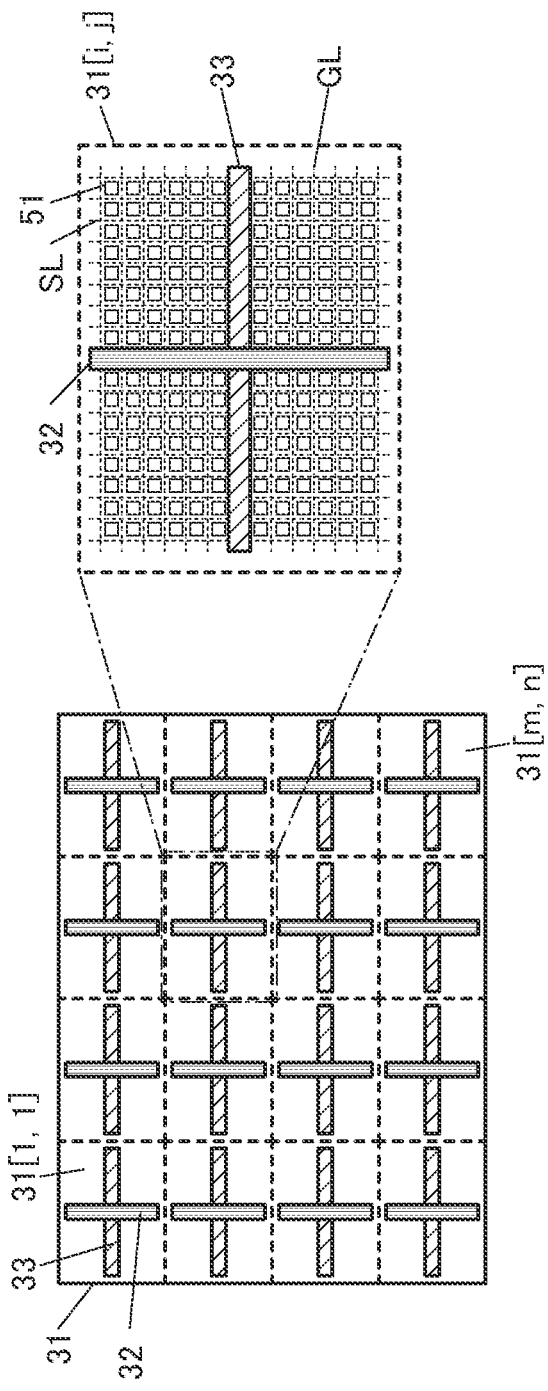

A schematic diagram illustrated in FIG. 5B is a structure example in which a plurality of sets each composed of the display unit 31, the first driver circuit 32, and the second driver circuit 33 illustrated in FIG. 5A are arranged. The display units 31, the first driver circuits 32, and the second driver circuits 33 are arranged in a matrix of m rows and n columns (m and n are each an integer greater than or equal to 1). In this specification and the like, the section in the first row and the first column is denoted by a display unit 31[1,1], and the section in the m-th row and the n-th column is denoted by a display unit 31[m,n]. The display unit 31[1,1] to the display unit 31[m,n], when combined, can make up the display unit 31. Note that the display unit 31[1,1] to the display unit 31[m,n] may be referred to as a sub-display unit. The display unit 31 can display one image with a plurality of sub-display units being combined. In FIG. 5B, an example where m is 4 and n is 4 is shown. In other words, the display unit 31 is divided into 16 parts. The display unit 31[1,1] to the display unit 31[m,n], into which the display unit 31 is divided, each include the first driver circuit 32 connected to the wiring GL and the second driver circuit 33 connected to the wiring SL.

When the display unit 31 and the display unit driver circuit 23 are provided in a region where they overlap with each other, the connection distance (wiring length) between the pixel circuit and the peripheral driver circuit can be very short. As a result, the wiring resistance and the parasitic capacitance are reduced, and thus time taken for charging and discharging can be reduced and high-speed driving can be achieved. Furthermore, the power consumption can be reduced. Furthermore, the size and weight of the display apparatus can be reduced.

The display unit 31 includes the first driver circuit 32 and the second driver circuit 33 for each of the display unit 31[1,1] to the display unit 31[m,n]. Thus, the display unit 31 is capable of rewriting an image for each of the display unit 31[1,1] to the display unit 31[m,n]. For example, the display unit 31 can perform image rewriting only in a section with an image change and can retain image data in a section with no change, thereby reducing the power consumption. That is, the number of image-rewriting times per unit time for image data in any one of the sub-display units, i.e., the display unit 31[1,1] to the display unit 31[m,n], can be smaller than the number of image-rewriting times per unit time for image data in the other sub-display units; thus, reduction in power consumption can be achieved.

In the display apparatus 100A, the control circuit 21 can set a driving frequency (e.g., a frame frequency, a frame rate, a refresh rate, or the like) for an image displayed on each of the display unit 31[1,1] to the display unit 31[m,n] as desired. Thus, the display apparatus 100A being combined with eye tracking or the like enables application of foveated rendering, which is a type of drawing with varied frame rates in different regions in accordance with the user's eye movement. Then, output of an image with excellent display quality can be achieved with a low load.

The control circuit 21 has a function of controlling the operation of each of the display unit 31[1,1] to the display unit 31[m,n]. In other words, the control circuit 21 has a function of controlling driving frequency and operation timing of each of the display unit 31[1,1] to the display unit 31[m,n] which are arranged in a matrix. In addition, the control circuit 21 has a function of adjusting synchronization among the display unit 31[1,1] to the display unit 31[m,n].

The display apparatus of one embodiment of the present invention, in which the pixel circuit and the peripheral driver circuit are stacked and the driving frequency is different between divided display units 31, can achieve low power consumption. For example, the driving frequency of each of the divided display units 31 is varied in accordance with the movement of the eye. Note that information on the movement of the eye (the gaze point G) is obtained by an eye tracking method such as a pupil center corneal reflection method or a bright/dark pupil effect method, for example. Alternatively, information on the eye movement may be obtained by an eye tracking method using laser, ultrasonic, or the like.

Figure 6A:
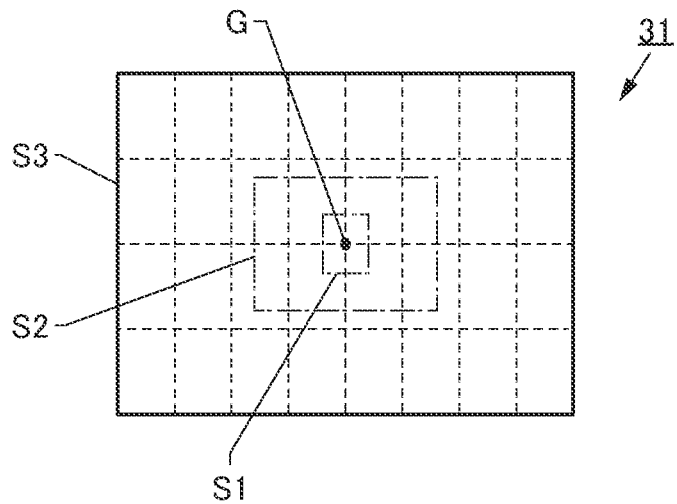
FIG. 6A to FIG. 6C are diagrams each illustrating a structure example of a display apparatus.
Figure 6B:
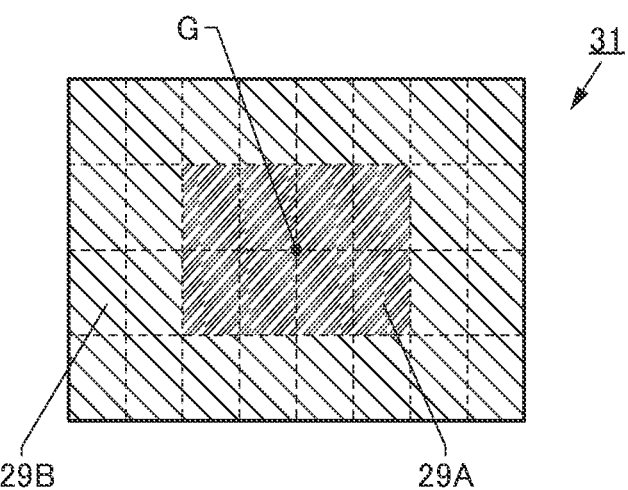

FIG. 6A illustrates the display unit 31 which is divided into 4 rows and 8 columns, i.e., into 32 parts. FIG. 6A also shows a first region S1 to a third region S3 with the gaze point G as the center. In the display unit 31, each of the divided parts of the display unit 31 is allocated to a first section 29A overlapping with the first region S1 or the second region S2, or a second section 29B overlapping with the third region S3. That is, in the display unit 31, each of the divided parts of the display unit 31 is allocated to the first section 29A or the second section 29B. In this case, the first section 29A overlapping with the first region S1 and the second region S2 corresponds to the display unit containing a region overlapping with the gaze point G, and the second section 29B is positioned outside the first section 29A and corresponds to the display unit that is positioned apart from the gaze point G of the user (see FIG. 6B).

The operation of the first driver circuit 32 and the second driver circuit 33 included in each of the divided parts of the display unit 31 is controlled by the control circuit 21. The display unit that corresponds to the second section 29B, for example, is a section overlapping with the third region S3 including a stable fixation field, an induced visual field, and an auxiliary visual field, which is a section where the user's discriminability is low. Thus, a reduction in practical display quality that the user perceives (hereinafter, also referred to simply as "practical display quality") even when the number of times of image data rewriting per unit time (hereinafter, also referred to as "image rewriting frequency") at the time of displaying an image is smaller in the display unit belonging to the second section 29B than in the display unit corresponding to the first section 29A. That is, even when the driving frequency of the display unit corresponding to the second section 29B is lower than the driving frequency of the display unit corresponding to the first section 29A, a reduction in practical display quality is small.

A decrease in driving frequency can result in a reduction in power consumption of the display apparatus. However, a decrease in driving frequency also results in a reduction in display quality. In particular, display quality at the time of displaying moving images deteriorates. According to one embodiment of the present invention, the driving frequency of the display unit corresponding to the second section 29B is made lower than the driving frequency of the display unit corresponding to the first section 29A; thus, power consumption can be reduced in a section where the visibility by the user is low without reducing the practical display quality. One embodiment of the present invention can achieve both display quality maintenance and a reduction in power consumption.

The driving frequency of the display unit corresponding to the first section 29A can be higher than or equal to 30 Hz and lower than or equal to 500 Hz, preferably higher than or equal to 60 Hz and lower than or equal to 500 Hz. The driving frequency of the display unit corresponding to the second section 29B is preferably lower than or equal to the driving frequency of the first section 29A, further preferably lower than or equal to a half of the driving frequency of the display unit corresponding to the first section 29A, still further preferably lower 25 than or equal to one fifth of the driving frequency of the display unit corresponding to the first section 29A.

Figure 6C:
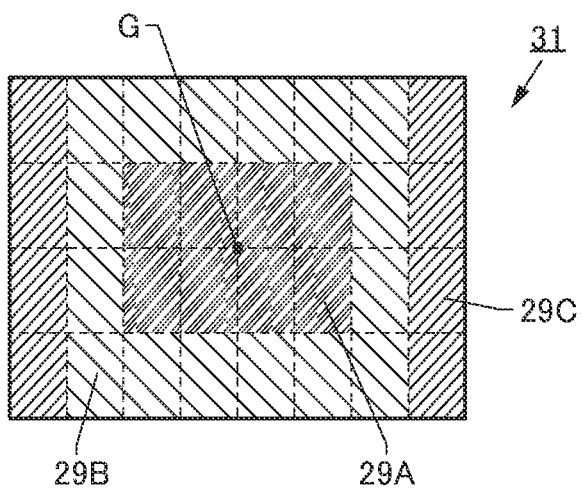

In addition, in the display unit corresponding to the third region S3, a third section 29C may be set outside the second section 29B (see FIG. 6C), and the driving frequency of the display unit corresponding to the third section 29C may be lower than that of the display unit corresponding to the second section 29B. The driving frequency of the display unit corresponding to the third section 29C is preferably lower than or equal to the driving frequency of the display unit corresponding to the second section 29B, further preferably lower than or equal to a half of the driving frequency of the display unit corresponding to the second section 29B, still further preferably lower than or equal to one fifth of the driving frequency of the display unit corresponding to the second section 29B. Significantly reducing the image rewriting frequency can further reduce power consumption. In addition, image data rewriting may be stopped, as necessary. Stopping image data rewriting can further reduce the power consumption.

When such a driving method is employed, a transistor with an extremely low off-state current is suitably used as a transistor included in the pixel circuit 51. For example, an OS transistor is suitably used as the transistor included in the pixel circuit 51. An OS transistor has an extremely low off-state current; stopping output signals output by the first driver circuit enables image data supplied to the pixel circuit 51 to be retained for a long time.

In some cases, an image whose brightness, contrast, color tone, or the like is greatly different from that of the previous image is displayed as in the case where an image scene displayed on the display unit 31 is changed, for example. Such a case causes a mismatch of the timing at which an image is changed between the first section 29A and a section whose driving frequency is lower than that of the first section 29A. This might cause a great difference in the brightness, contrast, color tone, or the like between the sections, leading to the loss of the practical display quality. In the case where an image scene is changed, for example, image rewriting is performed in the section other than the first section 29A at a driving frequency which is the same as that of the first section 29A, and then the driving frequency of the section other than the first section 29A is decreased.

Furthermore, in the case where the amount of positional change of the gaze point G is determined to be larger than a certain amount, image rewriting may be performed in the display unit other than the display unit corresponding to the first section 29A at a driving frequency which is the same as that of the display unit corresponding to the first section 29A, and the driving frequency of the display unit other than the display unit corresponding to the first section 29A may be decreased when the amount of positional change is determined to be within the certain amount. In the case where the amount of positional change of the gaze point G is determined to be small, the driving frequency of the display unit other than the display unit corresponding to the first section 29A may be further decreased.

Note that the divided display units that make up the display unit 31 are not limited to the three; the first section 29A, the second section 29B, and the third section 29C. The display unit 31 may include four or more sections. Setting a plurality of sections in the display unit 31 and gradually decreasing the driving frequency can further decrease a reduction in practical display quality.

When image data rewriting that is performed in each of the divided parts of the display unit 31 is performed concurrently in all of the divided display units, high-speed rewriting is achieved. In other words, when image data rewriting that is performed in each of the divided display units is performed concurrently in all of the divided display units, high-speed rewriting is achieved.

In addition, the display unit 31 of the display apparatus 100A described as an example in this embodiment is divided into eight parts in the column direction (FIG. 6A to FIG. 6C); thus, the length of the wiring GL electrically connecting the first driver circuit and the pixel circuit becomes ⅛. Accordingly, each of the resistance and parasitic capacitance of the wiring GL becomes ⅛, whereby degradation and delay of a signal can be inhibited and the time required for rewriting image data can be easily ensured.

Since the display apparatus 100A of one embodiment of the present invention allows time for writing image data to be shortened, display image rewriting can be performed at high speed. Thus, a display apparatus with high display quality can be achieved. In particular, a display apparatus which is excellent in moving image display can be achieved.

In addition, the display apparatus 100A of one embodiment of the present invention enables output signals output by the first driver circuit to be controlled independently for each of the divided display units, which allows the shape or size of the divided display units to be different from one another. In other words, the display unit 31 can be composed of display units with different shapes or sizes. Thus, the display unit 31 is not limited to a rectangular shape, and a display unit with a good design such as a round-shaped display unit can be provided.

<Structure Example of Pixel Circuit>

FIG. 7 to FIG. 9 illustrate structure examples of a pixel circuit that can be used for the pixel circuit 51 and a light-emitting element connected to the pixel circuit 51. Note that in the following description, the light-emitting element is not limited to an organic EL element and can be a self-luminous light-emitting device such as an LED (light emitting diode), a micro LED, a QLED (quantum-dot light-emitting diode), or a semiconductor laser.

In this specification and the like, the term "element" can be replaced with the term "device" in some cases. For example, a display element and a light-emitting element can be rephrased as a display device and a light-emitting device, respectively.

Figure 7A:
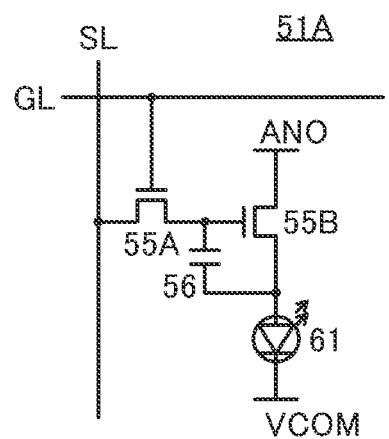
FIG. 7A to FIG. 7D are diagrams each illustrating a structure example of a display apparatus.

A pixel circuit 51A illustrated in FIG. 7A includes a transistor 55A, a transistor 55B, and a capacitor 56. FIG. 7A also illustrates a light-emitting element 61 connected to the pixel circuit 51A. FIG. 7A also illustrates the wiring SL, the wiring GL, a power supply line ANO, and a power supply line VCOM.

A gate of the transistor 55A is electrically connected to the wiring GL, one of a source and a drain of the transistor 55A is electrically connected to the wiring SL, and the other of the source and the drain of the transistor 55A is electrically connected to a gate of the transistor 55B and one electrode of the capacitor 56. One of a source and a drain of the transistor 55B is electrically connected to the power supply line ANO and the other of the source and the drain of the transistor 55B is electrically connected to an anode of the light-emitting element 61. The other electrode of the capacitor 56 is electrically connected to the anode of the light-emitting element 61. A cathode of the light-emitting element 61 is electrically connected to the power supply line VCOM. Note that the anode and the cathode of the light-emitting element 61 can be interchanged with each other as appropriate, when the amount of potential to be supplied is changed.

Figure 7B:
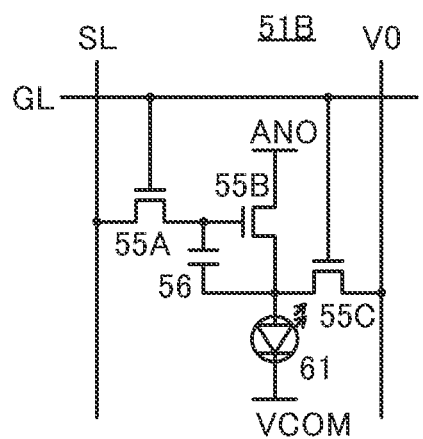

A pixel circuit 51B illustrated in FIG. 7B has a structure in which a transistor 55C is added to the pixel circuit 51A. A gate of the transistor 55C is electrically connected to the wiring GL, one of a source and a drain of the transistor 55C is electrically connected to an anode of the light-emitting element 61, and the other of the source and the drain of the transistor 55C is electrically connected to a wiring V0.

Figure 7C:
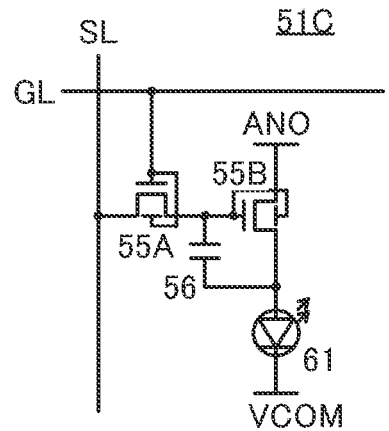
Figure 7D:
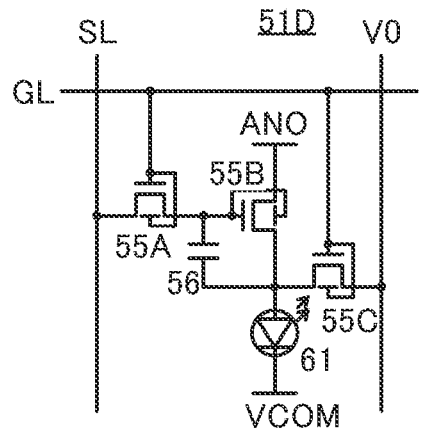

A pixel circuit 51C illustrated in FIG. 7C is an example in the case where a transistor with a pair of gates is used as each of the transistor 55A and the transistor 55B of the pixel circuit 51A. A pixel circuit 51D illustrated in FIG. 7D is an example where such transistors are employed in the pixel circuit 51B. Thus, current that can flow through the transistors can be increased. Note that although a transistor with a pair of gates is used as all the transistors here, one embodiment of the present invention is not limited thereto. A transistor that includes a pair of gates electrically connected to different wirings may be used. For example, when a transistor in which one of gates is electrically connected to a source is used, the reliability can be increased.

Figure 8A:
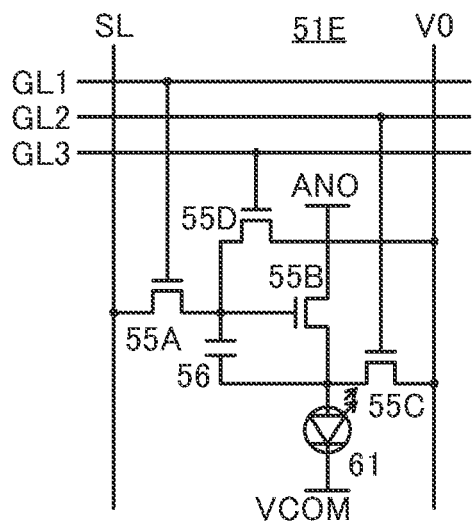
FIG. 8A to FIG. 8D are diagrams each illustrating a structure example of a display apparatus.

A pixel circuit 51E illustrated in FIG. 8A has a structure in which a transistor 55D is added to the pixel circuit 51B. Three gate lines (a wiring GL1, a wiring GL2, and a wiring GL3) are electrically connected to the pixel circuit 51E.

A gate of the transistor 55D is electrically connected to the wiring GL3, one of a source and a drain of the transistor 55D is electrically connected to the gate of the transistor 55B, and the other of the source and the drain of the transistor 55D is electrically connected to the wiring V0. In addition, the gate of the transistor 55A is electrically connected to the wiring GL1, and a gate of the transistor 55C is electrically connected to the wiring GL2.

When the transistor 55C and the transistor 55D are brought into conduction at the same time, the source and the gate of the transistor 55B have the same potential, so that the transistor 55B can be brought out of conduction in the case where the threshold voltage of the transistor 55B is greater than 0V. Thus, current flowing to the light-emitting element 61 can be blocked forcibly. Such a pixel circuit is suitable for the case of using a display method in which a display period and a non-lighting period are alternately provided.

Figure 8B:
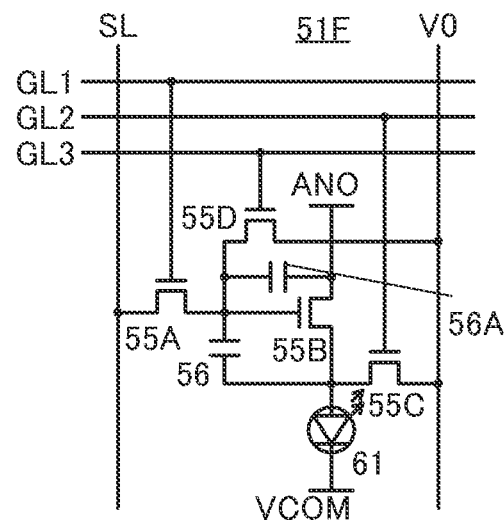

A pixel circuit 51F illustrated in FIG. 8B is an example where a capacitor 56A is added to the pixel circuit 51E. The capacitor 56A functions as a storage capacitor.

Figure 8C:
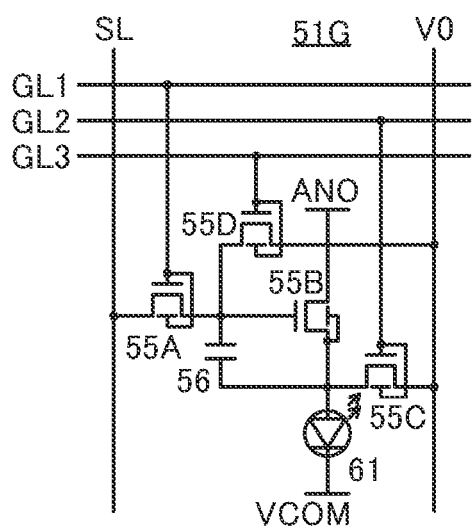
Figure 8D:
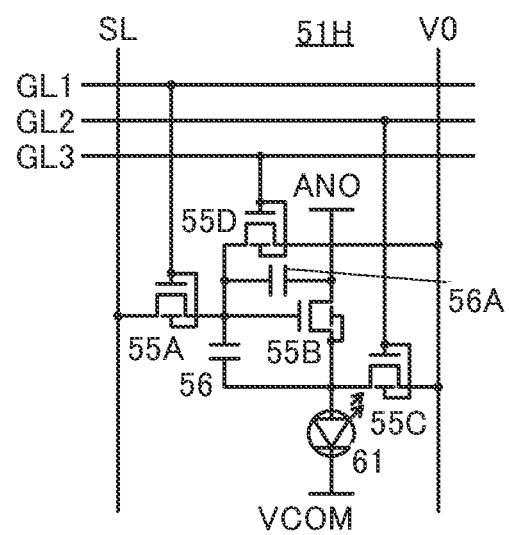

A pixel circuit 51G illustrated in FIG. 8C and a pixel circuit 51H illustrated in FIG. 8D are each an example where a transistor including a pair of gates is employed in the pixel circuit 51E or the pixel circuit 51F. A transistor whose pair of gates are electrically connected to each other is employed as each of the transistor 55A, the transistor 55C, and the transistor 55D, and a transistor whose one of gates is electrically connected to a source is employed as the transistor 55B.

FIG. 8A to FIG. 8D each illustrate a structure example where the transistors that constitute the circuit can be n-channel OS transistors only; however, one embodiment of the present invention is not limited thereto. For example, a pixel circuit that includes an OS transistor and a Si transistor may be employed. Specifically, for the pixel circuit 51A in FIG. 8A, the transistor 55A may be an OS transistor and the transistor 55B may be a Si transistor.

Figure 9A:
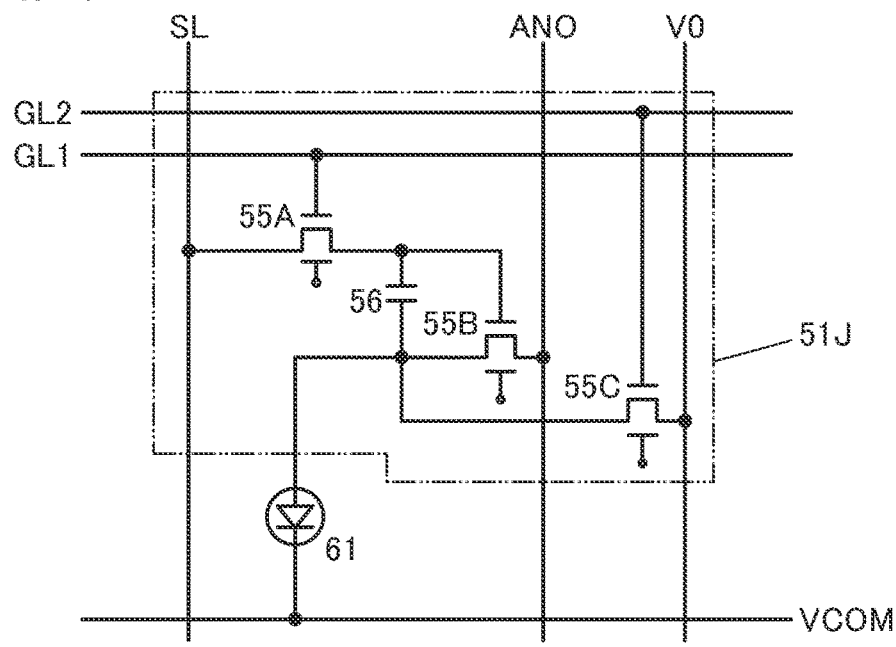
FIG. 9A and FIG. 9B are diagrams each illustrating a structure example of a display apparatus.
Figure 9B:
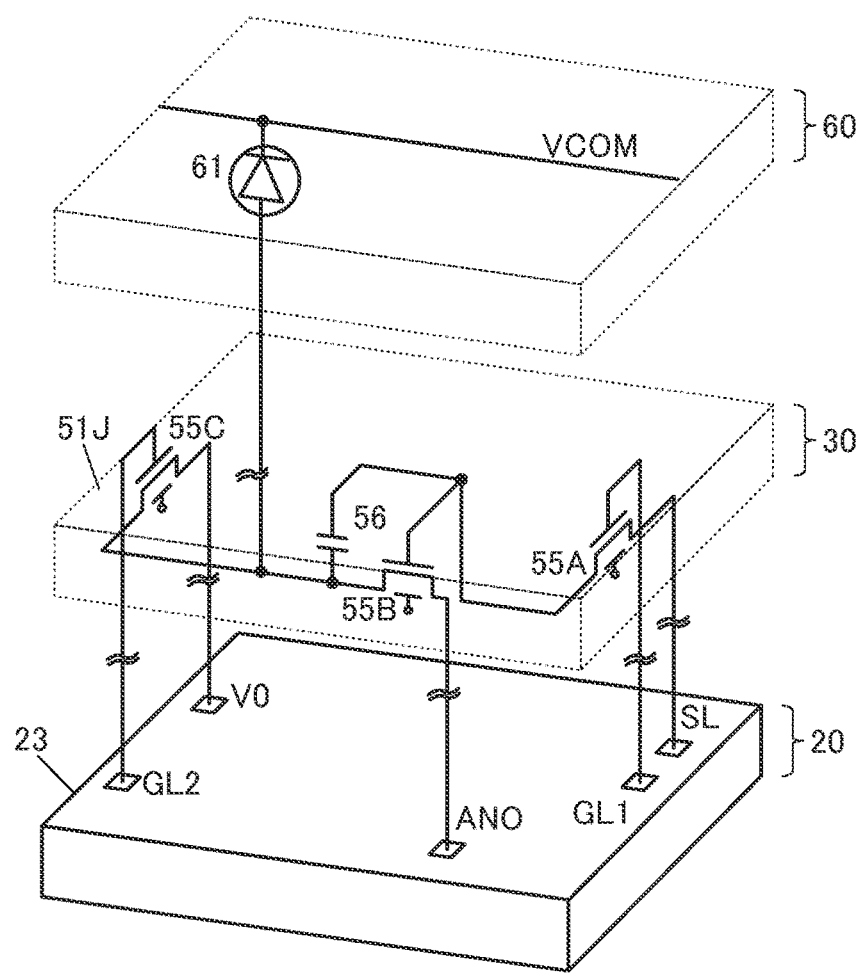

FIG. 9A illustrates a circuit configuration example of a pixel circuit (a pixel circuit 51J). FIG. 9B schematically illustrates the vertical positional relation between the layer 20 including the display unit driver circuit 23, the layer 30 including the pixel circuit 51, and the layer 60 including the light-emitting element 61.

The pixel circuit 51J illustrated as an example in FIG. 9A and FIG. 9B includes the transistor 55A, the transistor 55B, the transistor 55C, and the capacitor 56. The transistor 55A, the transistor 55B, and the transistor 55C can be OS transistors. Each of the OS transistors, the transistor 55A, the transistor 55B, and the transistor 55C, preferably includes a back gate electrode, in which case a structure in which the back gate electrode is supplied with the same signal as that supplied to a gate electrode or a structure in which the back gate electrode is supplied with a signal different from that supplied to the gate electrode can be used.

The transistor 55B includes a gate electrode electrically connected to the transistor 55A, a first electrode electrically connected to the light-emitting element 61, and a second electrode electrically connected to the power supply line ANO. The power supply line ANO is a wiring for supplying a potential for supplying current to the light-emitting element 61.

The transistor 55A includes a first electrode electrically connected to the gate electrode of the transistor 55B, a second electrode electrically connected to the wiring SL which functions as a source line, and the gate electrode having a function of controlling the conduction state or non-conduction state on the basis of the potential of the wiring GL1 which functions as a gate line.

The transistor 55C includes a first electrode electrically connected to the wiring V0, a second electrode electrically connected to the light-emitting element 61, and a gate electrode with a function of controlling its conduction state or non-conduction state on the basis of the potential of the wiring GL2 which functions as a gate line. The wiring V0 is a wiring for supplying a reference potential and a wiring for outputting current flowing through the pixel circuit 51 to the display unit driver circuit 23.

The capacitor 56 includes a conductive film electrically connected to the gate electrode of the transistor 55B and a conductive film electrically connected to a second electrode of the transistor 55C.

The light-emitting element 61 includes a first electrode electrically connected to the first electrode of the transistor 55B and a second electrode electrically connected to the power supply line VCOM. The power supply line VCOM is a wiring for supplying a potential for supplying current to the light-emitting element 61.

Accordingly, the intensity of light emitted from the light-emitting element 61 can be controlled in accordance with an image signal supplied to the gate electrode of the transistor 55B. Furthermore, variations in the gate-source potential of the transistor 55B can be inhibited by the reference potential of the wiring V0 supplied through the transistor 55C.

A current value that can be used for setting pixel parameters can be output from the wiring V0. More specifically, the wiring V0 can function as a monitor line for outputting current flowing through the transistor 55B or current flowing through the light-emitting element 61 to the outside. Current output to the wiring V0 may be converted into voltage by a source follower circuit or the like.

Note that in the structure example illustrated as an example in FIG. 9B, the wirings electrically connecting the pixel circuit 51J and the display unit driver circuit 23 can be shortened, so that wiring resistances of the wirings can be reduced. In addition, the parasitic capacitance of the wiring can be lowered. Thus, data can be written at high speed, which enables high-speed driving of the display unit 31. Therefore, even when the number of the pixel circuits 51 is increased, a sufficient frame period can be ensured, and thus, the pixel density of the display unit 31 can be increased. In addition, the increased pixel density of the display unit 31 can increase the resolution of an image displayed on the display unit 31. For example, the pixel density of the display unit 31 can be higher than or equal to 1000 ppi, higher than or equal to 5000 ppi, or higher than or equal to 7000 ppi. Thus, the display apparatus 100A can be used in display apparatuses for xR such as AR or VR, for example. The display apparatus 100A of one embodiment of the present invention can be suitably used for an electronic device whose display unit is close to a user, such as an HMD.

As described above, the display apparatus 100A of one embodiment of the present invention has a structure in which a layer including the display unit 31 and the memory unit 11 and a layer including the functional circuit 90 are stacked. Stacking layers that are provided with the circuits can reduce the size of the display apparatus 100A. In addition, when the display unit driver circuit 23 is provided to be overlapped with the display unit 31, the bezel width of a periphery of the display unit 31 can be made very narrow; therefore, the area of the display unit 31 can be expanded. Thus, the resolution of the display unit 31 can be increased. Consequently, the display quality of the display apparatus 100A can be improved.

In addition, in the case where the resolution of the display unit 31 is constant, the area occupied by one pixel can be increased. Thus, the emission luminance of the display unit 31 can be increased. Furthermore, the pixel aperture ratio can be increased. For example, the pixel aperture ratio can be greater than or equal to 40% and less than 100%, preferably greater than or equal to 50% and less than or equal to 95%, further preferably greater than or equal to 60% and less than or equal to 95%. Moreover, by the expansion of the area occupied by one pixel, the density of current supplied to pixels can be lowered. Accordingly, the load applied to the pixel is reduced, so that the reliability of the display apparatus 100A can be increased.

In addition, stacking the layer including the display unit 31 and the memory unit 11 and the layer including the functional circuit 90 can shorten the wirings that electrically connects them. Thus, the wiring resistance and the parasitic capacitance can be lowered, and the operation speed of the display apparatus 100A can be increased. Furthermore, power consumption of the display apparatus 100A is reduced.

<Structure Example of Memory Unit Driver Circuit>

FIG. 10A is a schematic diagram illustrating the connection relation between the memory unit driver circuit 24 and the memory unit 11. As described above, in one embodiment of the present invention, the memory unit driver circuit 24 and the memory unit 11 are provided in different layers; thus, the memory unit 11 can be provided over the memory unit driver circuit 24.

The memory unit driver circuit 24 includes a first driver circuit 35 and a second driver circuit 36. A circuit included in the first driver circuit 35 functions as, for example, a word line driver circuit or a row circuit. A circuit included in the second driver circuit 36 functions as, for example, a bit line driver circuit or a column circuit. The first driver circuit 35 is electrically connected, through a word line WL, to the memory cell 12 in the memory unit 11 provided above. Note that the word lines WL may include more than one word line such a word line WWL for data writing, a word line RWL for data reading, and the like. The second driver circuit 36 is electrically connected, through a bit line BL, to the memory cell 12 in the memory unit 11 provided above. Note that the bit lines BL may include more than one bit line, such as a bit line WBL for data writing and a bit line RBL for data reading.

The first driver circuit 35 has a function of selecting a row to be accessed. For example, the first driver circuit 35 includes a row decoder and a word line driver. The second driver circuit 36 has a function of precharging the bit lines BL, a function of writing data to the bit line BL, a function of amplifying data of the bit line BL, a function of reading data from the bit line BL, and the like. Note that an input/output circuit is provided as another circuit of the memory unit driver circuit 24. The input/output circuit has a function of holding data for writing, a function of holding readout data, and the like.

When the memory unit 11 and the memory unit driver circuit 24 are provided to overlap with each other, the connection distance (wiring length) between the memory cell and the memory unit driver circuit can be very short. As a result, the wiring resistance and the parasitic capacitance are reduced, and thus time taken for charging and discharging can be reduced and high-speed driving can be achieved. Furthermore, the power consumption can be reduced. Furthermore, reduction in size and weight can be achieved. In addition, the integration degree of the memory cell array can be increased.

Note that in the memory unit driver circuit 24, the first driver circuit 35 or the second driver circuit 36 does not have to be in a region overlapping with the memory unit 11. For example, the first driver circuit 35 or the second driver circuit 36 may be in a region overlapping with the display unit 31. FIG. 10B illustrates a state where the first driver circuit 35 is provided in a region overlapping with the memory unit 11 and the second driver circuit 36 is provided in a region not overlapping with the memory unit 11 in the memory unit driver circuit 24.

<Structure Example of Memory Cell>

Here, structure examples of a memory cell including an OS transistor will be described with reference to FIG. 11A to FIG. 11H. Note that memory cells 12A to 12H illustrated in FIG. 11A to FIG. 11H are memory cells formed using OS transistors, and can be classified roughly into a NOSRAM (FIG. 11A to FIG. 11F) and a DOSRAM (FIG. 11G and FIG. 11H).

Figure 11A:
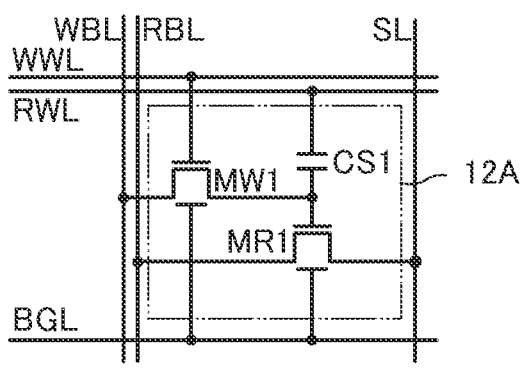
FIG. 11A to FIG. 11H are diagrams each illustrating a structure example of a display apparatus.

FIG. 11A illustrates a circuit configuration example that can be applied to the memory cell 12. The memory cell 12A here is a 2-transistor (2T) gain cell. The memory cell 12A includes transistors MW1 and MR1 and a capacitor CS1. The transistor MW1 is a write transistor and the transistor MR1 is a readout transistor. Backgates of the transistors MW1 and MR1 are electrically connected to the wiring BGL.

Since the readout transistor is composed of an OS transistor, the memory cell 12A does not consume power for data retention. Thus, the memory cell 12A is a low-power memory cell that can hold data for a long time, and the memory unit 11 can be used as a non-volatile memory device.

Figure 11B:
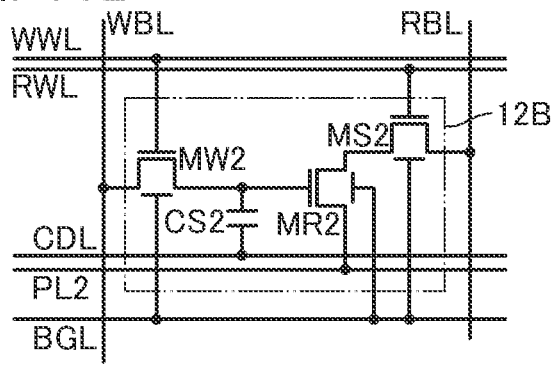

The memory cell 12B illustrated in FIG. 11B is a 3T gain cell, which includes a transistor MW2, a transistor MR2, a transistor MS2, and a capacitor CS2. The transistors MW2, MR2, and MS2 are a write transistor, a readout transistor, and a selection transistor, respectively. Backgates of the transistors MW2, MR2, and MS2 are electrically connected to the wiring BGL. The memory cell 12B is electrically connected to the word lines RWL and WWL, the bit lines RBL and WBL, a capacitor line CDL, and a power supply line PL2. For example, a voltage GND (low-level-side power supply voltage) is input to the capacitor line CDL and the power supply line PL2.

Figure 11C:
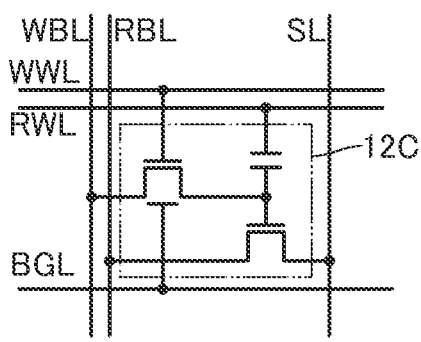
Figure 11D:
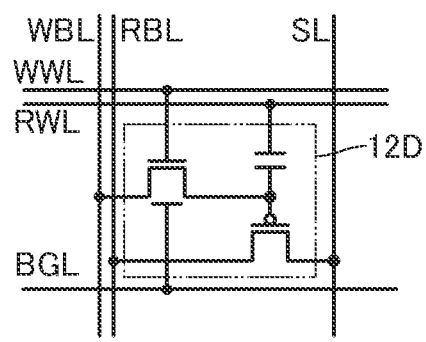

FIG. 11C and FIG. 11D illustrate other configuration examples of a 2T gain cell. In a memory cell 12C illustrated in FIG. 11C, a readout transistor is composed of an n-channel Si transistor. In a memory cell 12C illustrated in FIG. 11D, a readout transistor is composed of a p-channel Si transistor. As illustrated in FIG. 11C and FIG. 11D, transistors in the memory cell may be a combination of an OS transistor and a Si transistor.

Since a metal oxide used for an OS transistor is of an N-type (n-channel type), typified by an In—Ga—Zn oxide, for example, a CMOS (Complementary Metal Oxide Semiconductor) circuit can be formed when an OS transistor and a Si transistor are combined to form a memory cell. Thus, it is possible to achieve a circuit that has both a feature of high driving capability due to the use of a Si transistor and a feature of low power consumption due to the low off-state current of an OS transistor, as compared with a case where a memory cell is composed only of n-channel transistors. In addition, since it is not necessary to separately form N-type (n-channel type) and P-type (p-channel type) Si transistors, a reduction in transistor's process cost can be achieved.

Figure 11E:
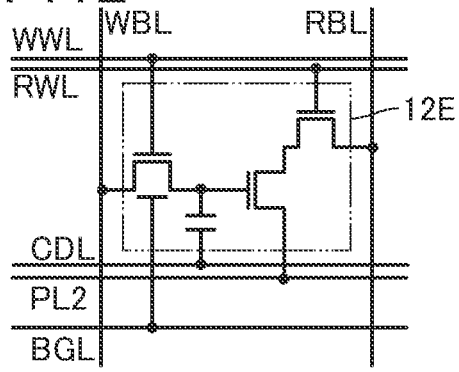
Figure 11F:
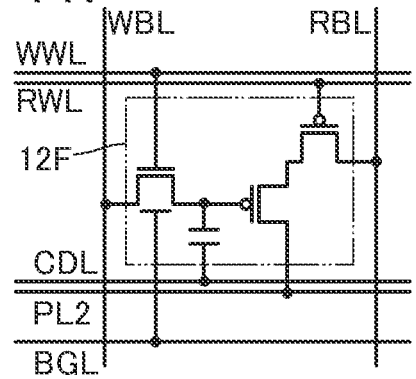
Figure 11G:
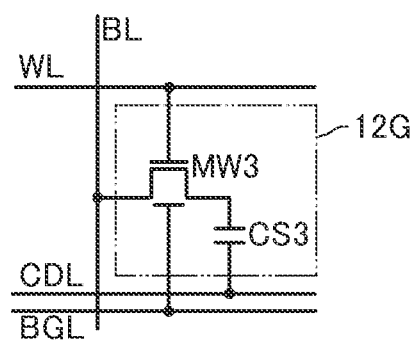
Figure 11H:
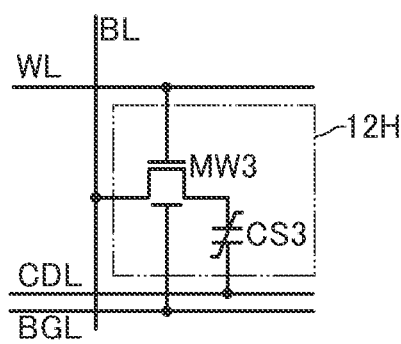

FIG. 11E and FIG. 11F illustrate other configuration examples of a 3T gain cell. In a memory cell 12E illustrated in FIG. 11E, a readout transistor and a selection transistor are composed of n-channel Si transistors. In a memory cell 12F illustrated in FIG. 11F, a readout transistor and a selection transistor are composed of p-channel Si transistors. In the example of FIG. 11F, the voltage Vdd (high-level-side power supply voltage) is input to the power supply line PL2.

In the above gain cells, a bit line serving as both of the readout bit line RBL and the write bit line WBL may be provided.

FIG. 11G and FIG. 11H illustrate examples of a 1T1C (capacitor) memory cell. A memory cell 12G illustrated in FIG. 11G is electrically connected to the word line WL, the bit line BL, the capacitor line CDL, and the wiring BGL. The memory cell 12G includes a transistor MW3 and a capacitor CS3. A backgate of the transistor MW3 is electrically connected to the wiring BGL. A memory cell 12H illustrated in FIG. 11H has a structure of a ferroelectric memory using a capacitor FEI including a ferroelectric material as the capacitor CS3. For example, HfZrOx can be used as the ferroelectric material.

The circuit configuration of the memory cell 12 in the memory unit 11 can be a circuit configuration including only OS transistors, a circuit configuration with an OS transistor and a Si transistor being combined, or the like.

Figure 12A:
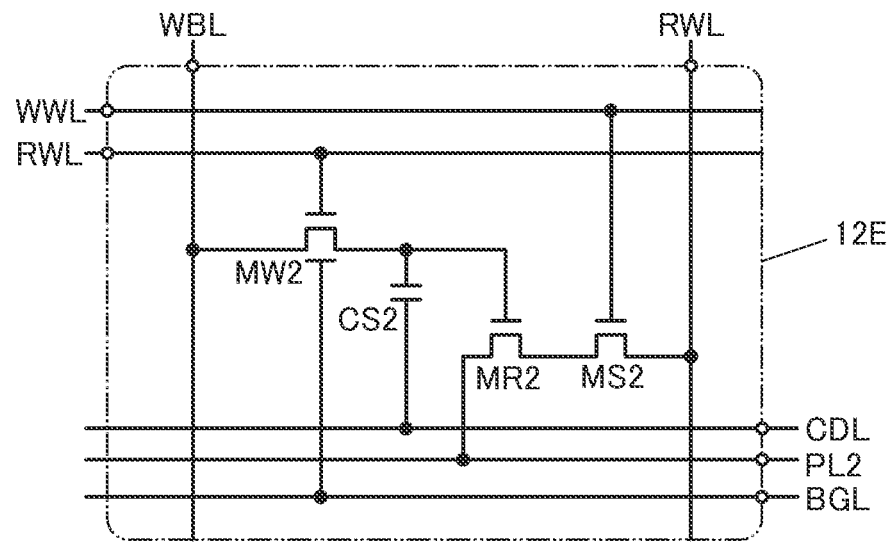
FIG. 12A and FIG. 12B are diagrams each illustrating a structure example of a display apparatus.
Figure 12B:
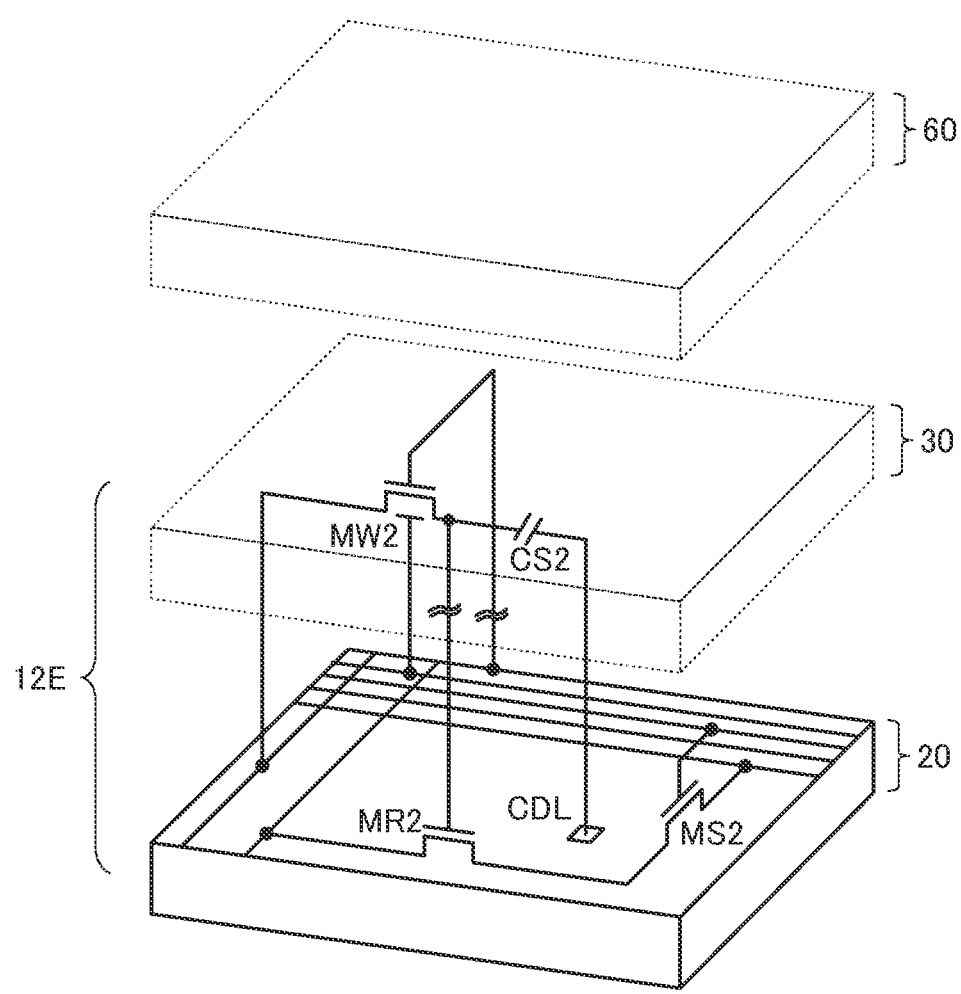

FIG. 12A illustrates a circuit configuration example of the memory cell (memory cell 12E). FIG. 12B is a diagram schematically illustrating the vertical position relation between the layer 20 including the memory unit driver circuit 24, the layer 30 including the memory cell 12, and the layer 60. Note that in the memory unit 11 where the memory cell 12E is provided, the structure of the layer 60 is not illustrated; however, the light-emitting element 61 may be provided in the layer 60, for example.

The memory cell 12E illustrated as an example in FIG. 12A and FIG. 12B includes the transistors MW2, MR2, and MS2, and the capacitor CS2. The transistor MW2 can be an OS transistor, and the transistors MR2 and MS2 can be Si transistors. That is, as illustrated in FIG. 12B, the transistors MR2 and MS2 are provided in the layer 20, and the transistor MW2 is provided in the layer 30. Although the capacitor CS2 is illustrated in the layer 30, the capacitor CS2 may be provided in the layer 20. Although the wirings (the word lines RWL and WWL and the bit lines RBL and WBL) and the like are illustrated in the layer 20, they may be provided in the layer 30.

Figure 13A:
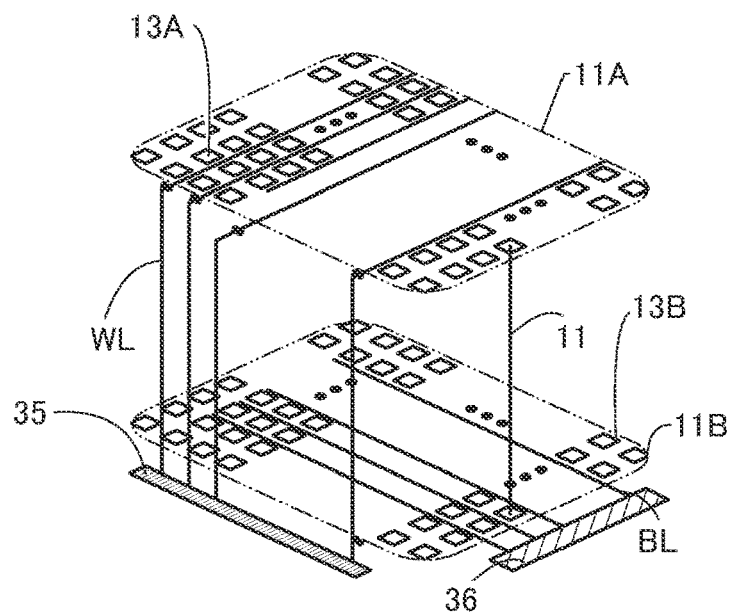
FIG. 13A and FIG. 13B are diagrams each illustrating a structure example of a display apparatus.

As illustrated in FIG. 12B, the memory cell 12E including an OS transistor and Si transistors can be provided in the layer 20 and the layer 30. FIG. 13A is a schematic view illustrating a connection relation between the first driver circuit 35 and the second driver circuit 36 included in the memory unit driver circuit 24 and memory units 11A and 11B including a memory cell which are provided in the layer 20 and the layer 30.

In FIG. 13A, the memory unit 11A is provided in the layer 30 and is a region where a circuit 13A corresponding to part of the memory cell 12E is provided. The memory unit 11B is provided in the layer 20 and is a region where a circuit 13B corresponding to part of the memory cell 12E is provided. The memory unit 11A and the memory unit 11B in combination correspond to the above-described memory unit 11. The circuit 13A and the circuit 13B in combination correspond to the above-described memory cell 12E. Note that in the layer 20, the first driver circuit 35 and the second driver circuit 36 may be provided in a region overlapping with the memory unit 11A as illustrated in FIG. 13A, or may be provided in a region overlapping with the memory unit 11A.

Figure 13B:
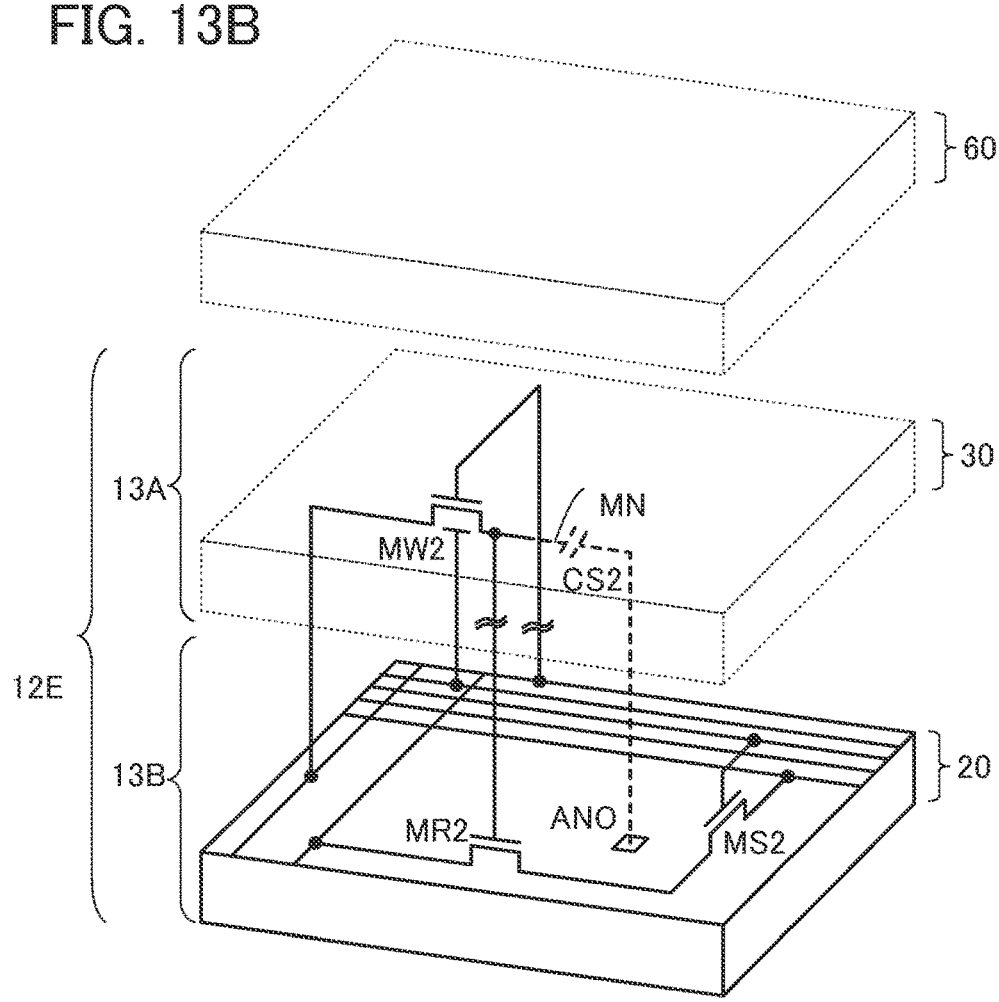

The structure in which the circuit 13A and the circuit 13B are separately provided in the layer 20 and the layer 30 that are different layers will be described with reference to FIG. 13B. In the memory cell 12E including an OS transistor and Si transistors, a wiring that makes connection between different layers is provided, unlike a case where transistors are provided in the same layer, so that transistors are provided to be apart from each other. Thus, in a node MN in FIG. 13B, parasitic capacitance (parasitic capacitance between the node MN and the power supply line ANO is illustrated in FIG. 13B) can be large, so that the capacitor CS2 (shown by dotted line in the figure) can be omitted.

Figure 14A:
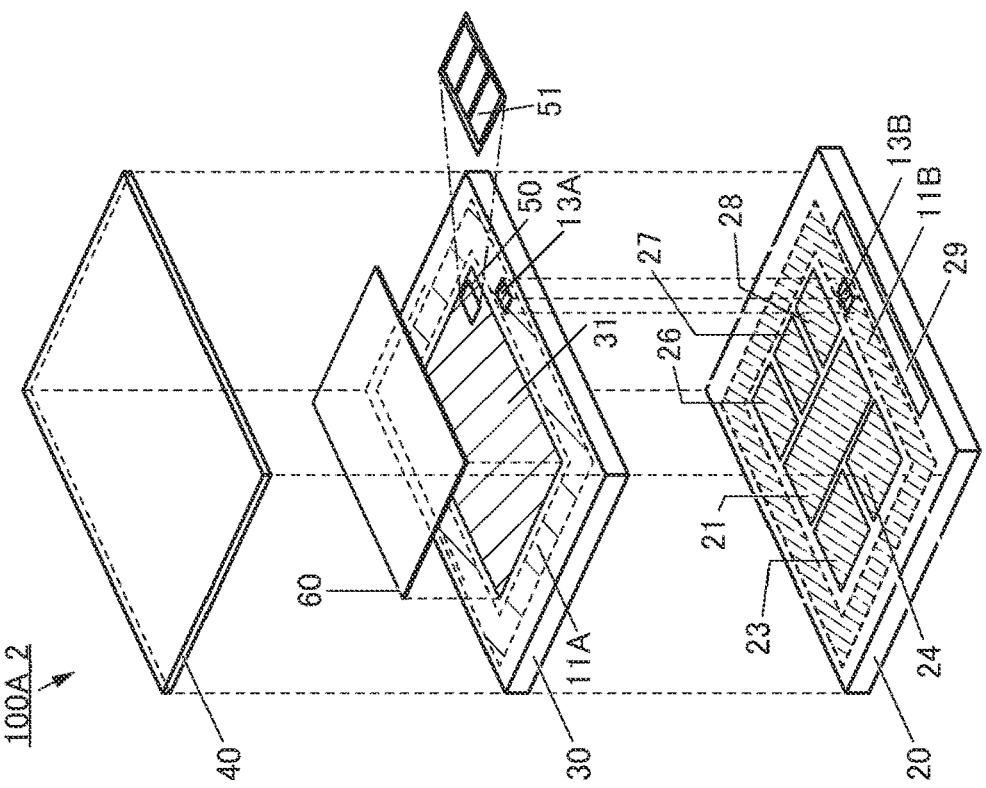
FIG. 14A and FIG. 14B are diagrams each illustrating a structure example of a display apparatus.
Figure 14B:
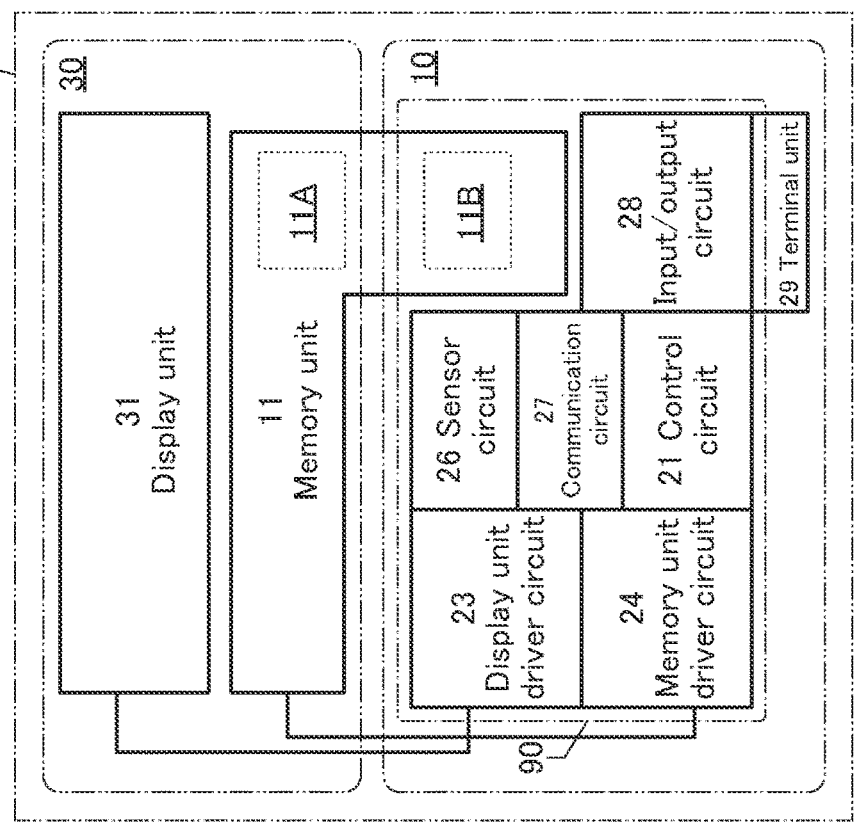

FIG. 14A is a block diagram of a structure of a display apparatus 100A_2, in which the memory unit 11 includes the memory unit 11A and the memory unit 11B that are provided in different layers as described with reference to FIG. 12A to FIG. 13B. FIG. 14B is a perspective view corresponding to the block diagram of the display apparatus 100A_2 illustrated in FIG. 14A. In a manner similar to FIG. 2, FIG. 14B shows the layer 20, the layer 30, the layer 60, the sealing substrate 40, and the like being spaced apart from one another so that the structure of the display apparatus 100A_2 can be easily understood. Note that the circuit 13A and the circuit 13B included in the memory unit 11A and the memory unit 11B are illustrated in a region different from the pixel 50 included in the display unit 31; however, they can be provided in the pixel circuit 51 as illustrated in FIG. 4.

In the display apparatus of one embodiment of the present invention, in the memory unit including an OS transistor like the display unit does, a memory cell including an OS transistor such as a NOSRAM or a DOSRAM is included. Therefore, the memory cell can be placed in a layer different from that with a circuit using Si transistors, such as a display unit driver circuit and a memory unit driver circuit, as compared with a memory cell composed of Si transistors such as a static RAM (SRAM).

In one embodiment of the present invention, the memory unit including the memory cell with use of an OS transistor can increase the capacity of data to be stored because: the memory unit can be composed of a memory cell with a smaller number of transistors than an SRAM; the memory unit has a circuit configuration in which an OS transistor and a Si transistor are combined; and the memory unit is capable of storing multi-level data. Accordingly, image data of a plurality of frames can be retained. Thus, the memory unit can be used as a frame memory capable of storing high-capacity image data. As a result, the display apparatus of one embodiment of the present invention can retain image data of a plurality of frame periods. In that case, the amount of transfer of image data from an external circuit to the display apparatus can be reduced, so that the display system including the display apparatus can be simplified.

Embodiment 2

In this embodiment, modification examples of the display apparatus according to one embodiment of the present invention will be described. Note that in this embodiment, structures denoted by the same reference numerals as those in the above embodiment are not repeatedly described in some cases.

Modification Example 1

Figure 15A:
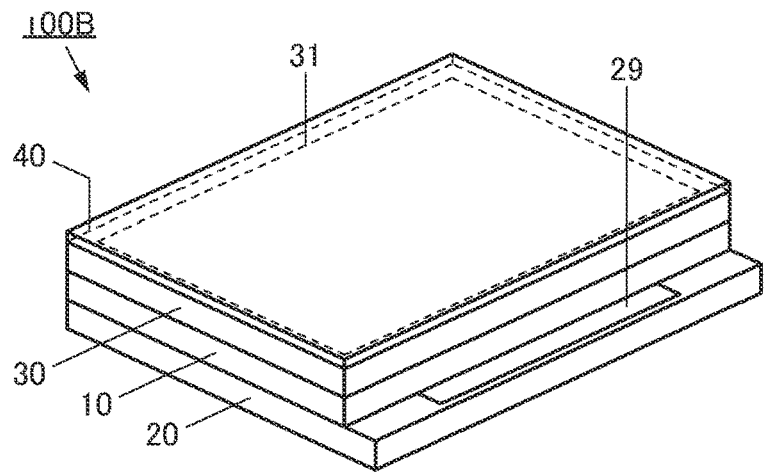
FIG. 15A and FIG. 15B are diagrams each illustrating a structure example of a display apparatus.
Figure 15B:
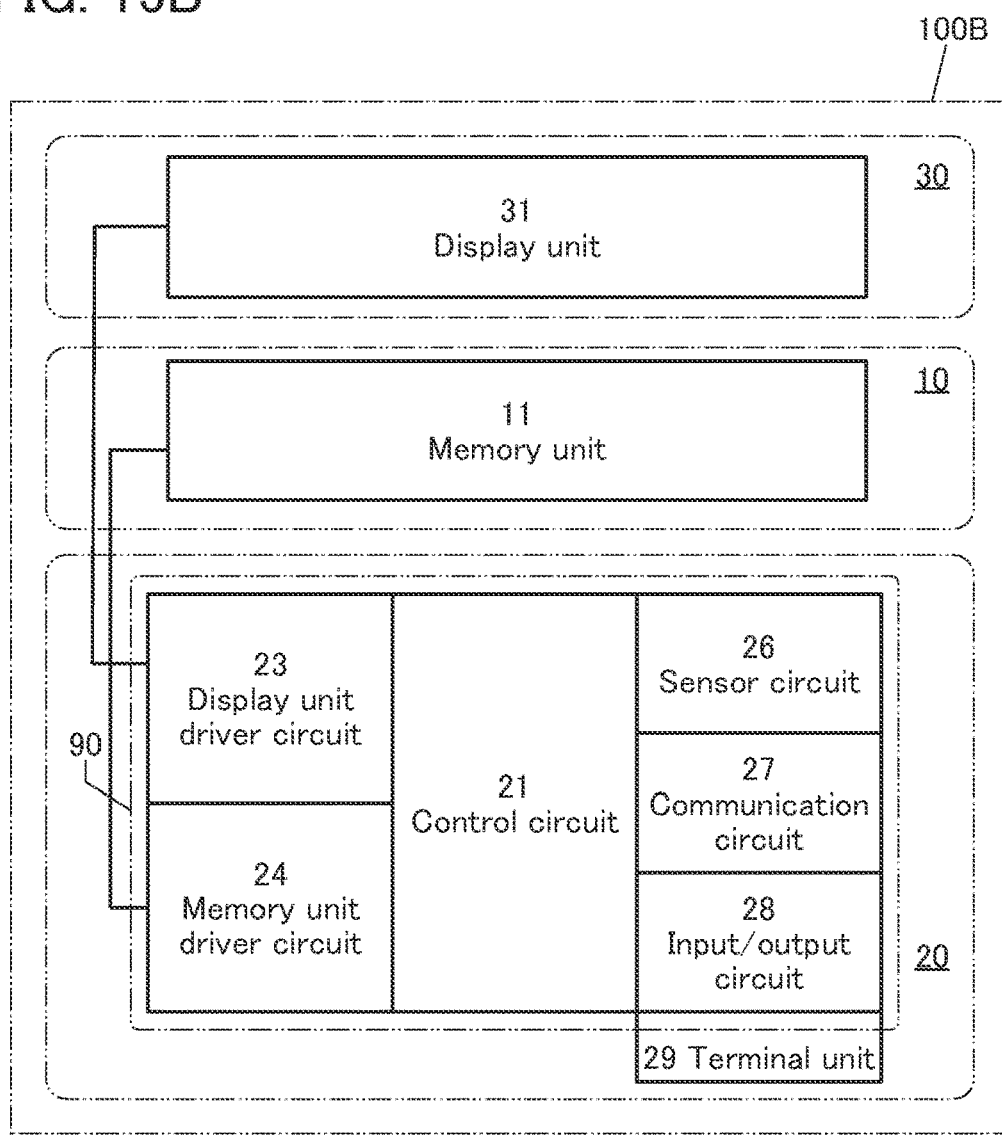
Figure 16:
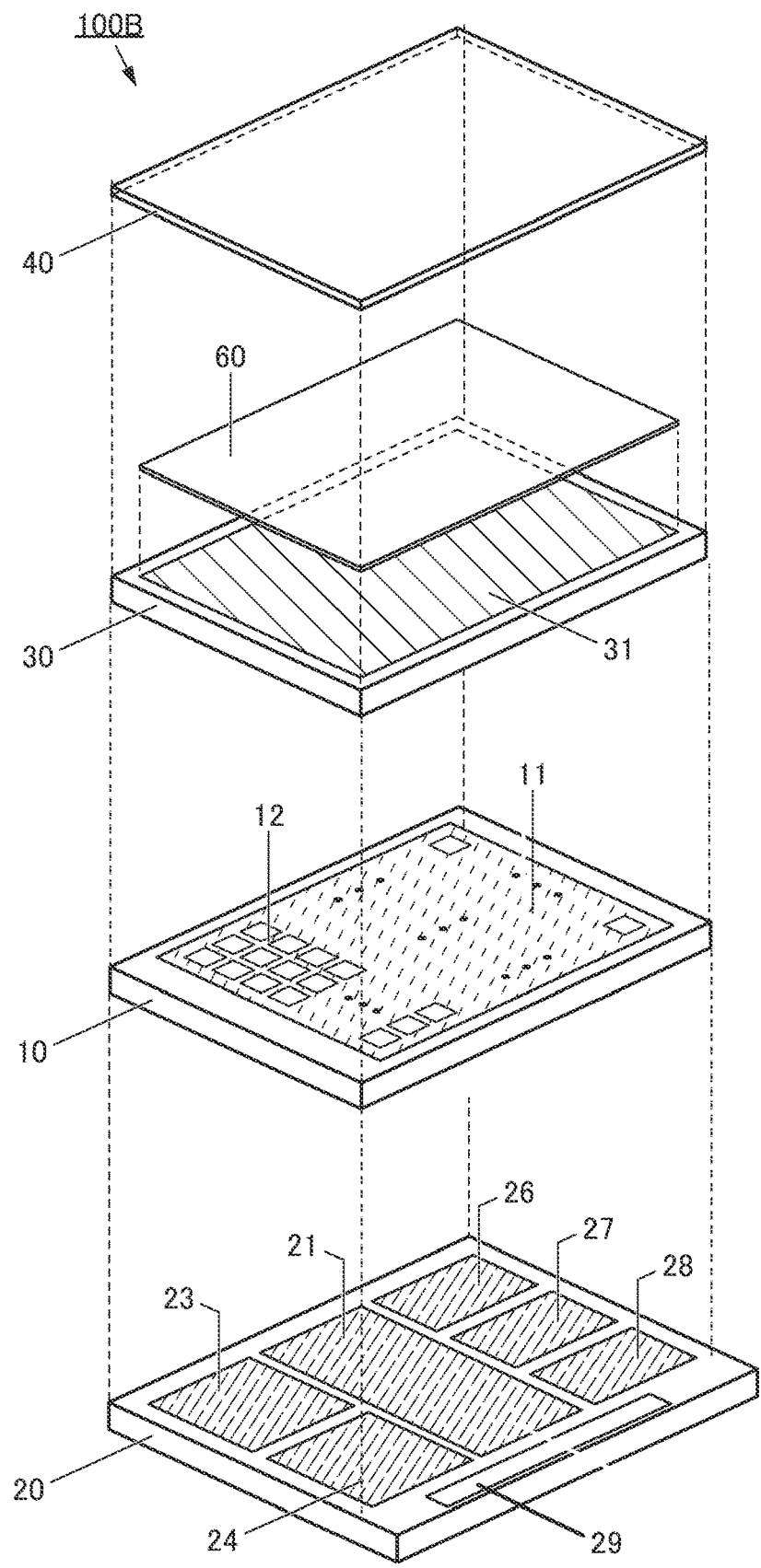
FIG. 16 is a diagram illustrating a structure example of a display apparatus.

FIG. 15A and FIG. 16 are each a perspective view of a display apparatus 100B of one embodiment of the present invention. FIG. 15B is a block diagram illustrating a structure of the display apparatus 100B. The display apparatus 100B includes a layer 10 over the layer 20, the layer 30 over the layer 10, and the sealing substrate 40 over the layer 30. The layer 30 is provided with the display unit 31, and the layer 60 is provided between the sealing substrate 40 and the display unit 31. The layer 10 includes the memory unit 11. FIG. 16 shows the layer 20, the layer 30, the layer 60, the sealing substrate 40, and the like being spaced apart from each other for easy understanding of the structure of the display apparatus 100B.

For the layer 20, the same description as that in Embodiment 1 above can be given.

The memory unit 11 provided in the layer 10 includes a plurality of memory cells 12. In the structure of the display apparatus 100B, the display unit and the memory unit are respectively provided in the layer 10 and the layer 30 which are different layers. Thus, the area of the display unit 31 and the capacity of the memory unit 11 can be increased. Although the memory cell 12 included in the memory unit 11 and the pixel circuit 51 included in the display unit 31 are provided in different layers, they each include an OS transistor.

In the structure of one embodiment of the present invention, the memory unit 11 can be provided in the layer 10, which is a layer different from the layer 30 provided with the display unit 31. Thus, the display area as well as the memory capacity of the display apparatus 100B can be increased. When the memory unit 11 stores image data output from an external circuit, the memory unit 11 can be used as a frame memory.

As described above, the display apparatus 100B of one embodiment of the present invention has a structure in which the layer including the display unit 31, the layer including the memory unit 11, and the layer including the functional circuit 90 are stacked. Stacking layers provided with the circuits can reduce the size of the display apparatus 100B. In addition, since the display unit driver circuit 23 can be provided to overlap with the display unit 31, the area of the display unit 31 can be enlarged. Thus, the resolution of the display unit 31 can be increased, so that the display quality of the display apparatus 100B can be improved.

Furthermore, stacking the layer including the display unit 31, the layer including the memory unit 11, and the layer including the functional circuit 90 can shorten the wirings that electrically connect them to one another. Thus, the wiring resistance and the parasitic capacitance can be lowered, and the operation speed of the display apparatus 100B can be increased. In addition, power consumption of the display apparatus 100B is reduced.

Modification Example 2

Figure 17A:
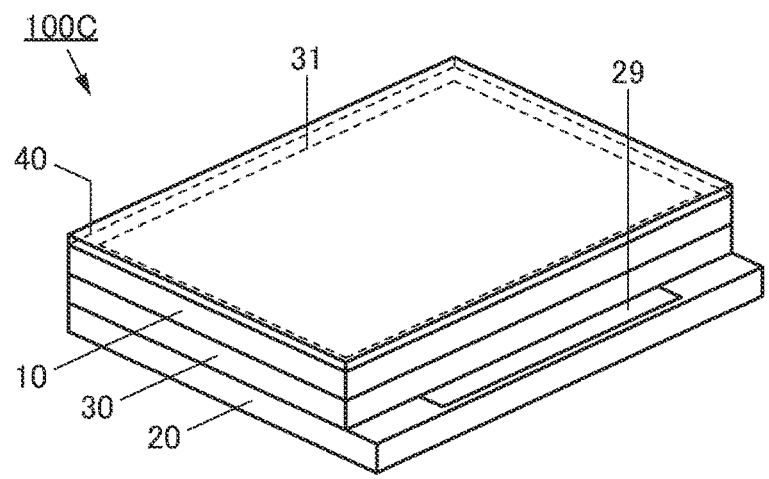
FIG. 17A and FIG. 17B are diagrams each illustrating a structure example of a display apparatus.
Figure 17B:
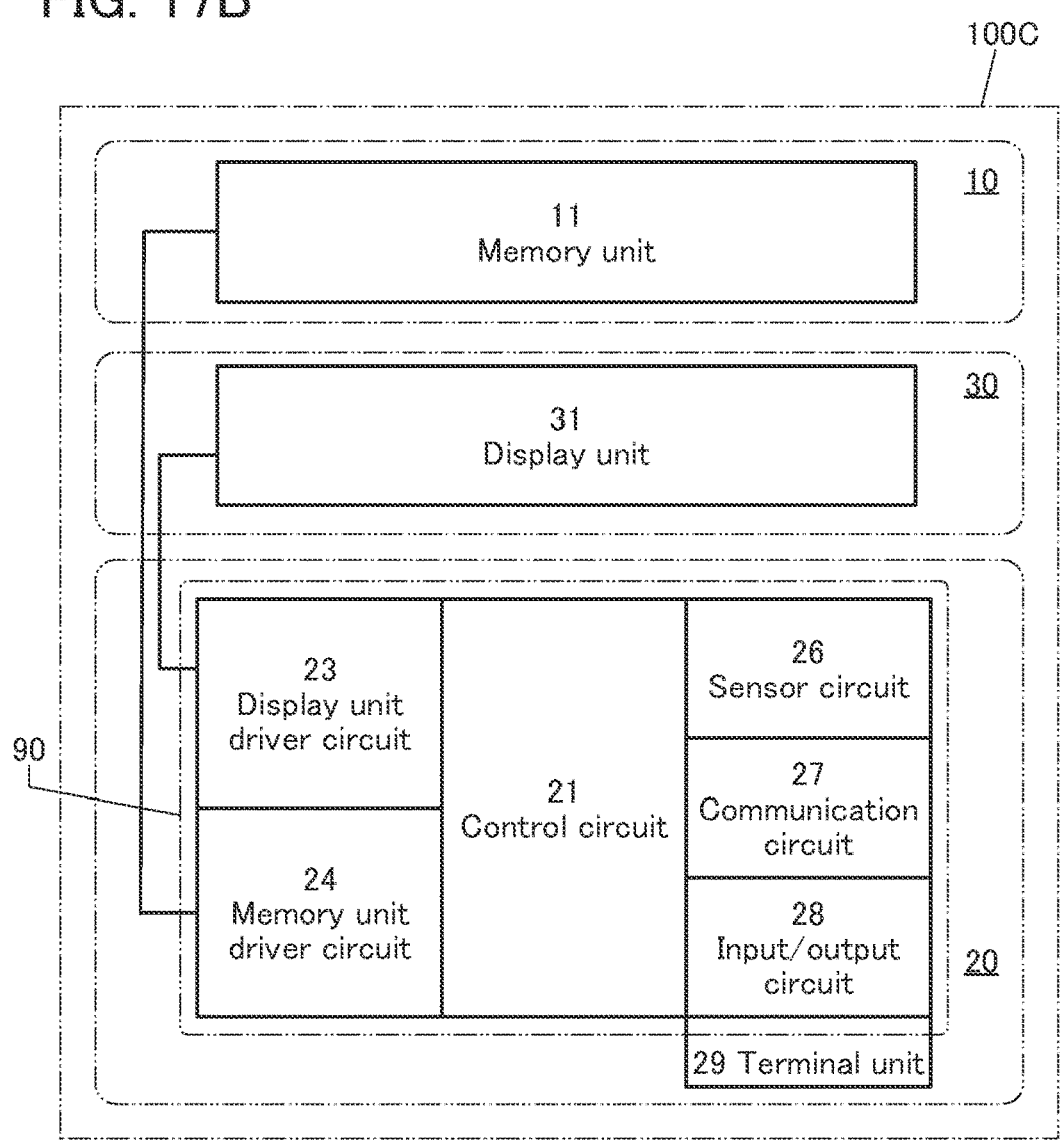
Figure 18:
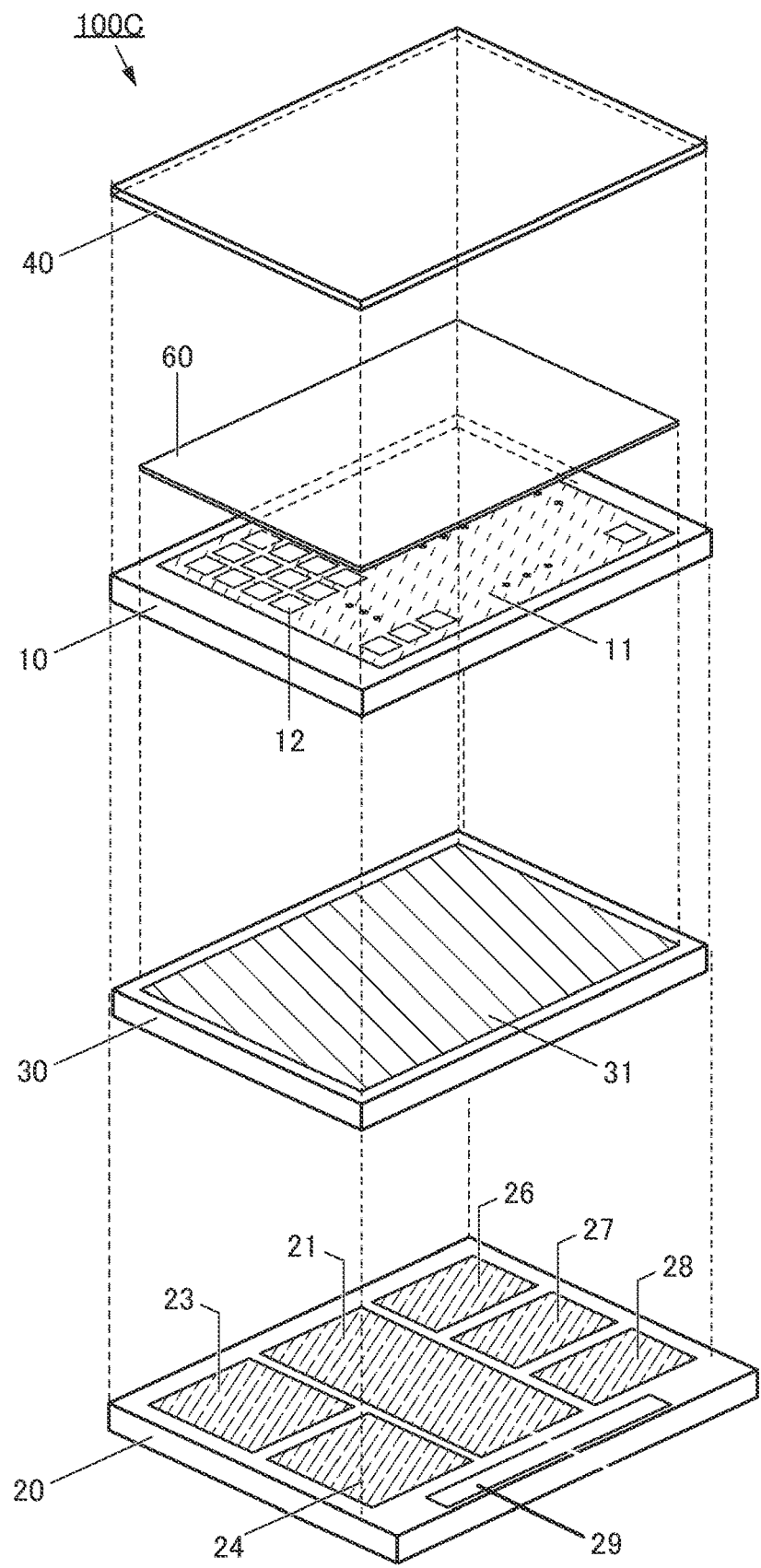
FIG. 18 is a diagram illustrating a structure example of a display apparatus.

FIG. 17A and FIG. 18 are each a perspective view of a display apparatus 100C of one embodiment of the present invention. The display apparatus of one embodiment of the present invention can change the stacking order of layers depending on the purpose or the usage. FIG. 17B is a block diagram illustrating a structure of the display apparatus 100C. The display apparatus 100C includes the layer 30 over the layer 20, the layer 10 over the layer 30, and the sealing substrate 40 over the layer 10. The layer 30 includes the display unit 31, and the layer 60 is provided between the sealing substrate 40 and the memory unit 11. The layer 10 includes the memory unit 11. FIG. 16 shows the layer 20, the layer 30, the layer 60, the sealing substrate 40, and the like being spaced apart from one another so that the structure of the display apparatus 100C can be easily understood.

The description of the layer 20 is similar to that in Embodiment 1 above.

The display unit 31 provided in the layer 30 is provided apart from the layer 60 including a light-emitting element, with the memory unit 11 in the layer 10 being placed therebetween. Thus, in the memory unit 11, a wiring for connecting the memory unit 11 in the layer 10 and the light-emitting element of the layer 60 is provided. Due to the wiring, parasitic capacitance in the memory cell 12 included in the memory unit 11 increases. When the parasitic capacitance is used in the memory cell, the other capacitance can be reduced. As a result, the area of the display unit 31 and the capacity of the memory unit 11 can be increased. Note that the memory cell 12 included in the memory unit 11 and the pixel circuit 51 included in the display unit 31 each include an OS transistor, although they are provided in different layers.

In the structure of one embodiment of the present invention, the memory unit 11 can be provided in the layer 10, which is a layer different from the layer 30 provided with the display unit 31. Thus, the display area as well as the memory capacity of the display apparatus 100C can be increased. When the memory unit 11 stores image data output from an external circuit, the memory unit 11 can be used as a frame memory.

As described above, the display apparatus 100C of one embodiment of the present invention has a structure in which the layer including the display unit 31, the layer including the memory unit 11, and the layer including the functional circuit 90 are stacked. Stacking layers provided with the circuits can reduce the size of the display apparatus 100C. In addition, since the display unit driver circuit 23 can be provided to overlap with the display unit 31, the area of the display unit 31 can be enlarged. Thus, the resolution of the display unit 31 can be increased, so that the display quality of the display apparatus 100C can be improved.

Furthermore, when the layer including the memory unit 11 is provided between the layer including the display unit 31 and the layer including the light-emitting element, parasitic capacitance in the memory cell 12 included in the memory unit 11 can be increased. Thus, using the parasitic capacitance in the memory cell enables the other capacitance to be reduced.

Modification Example 3

Figure 19:
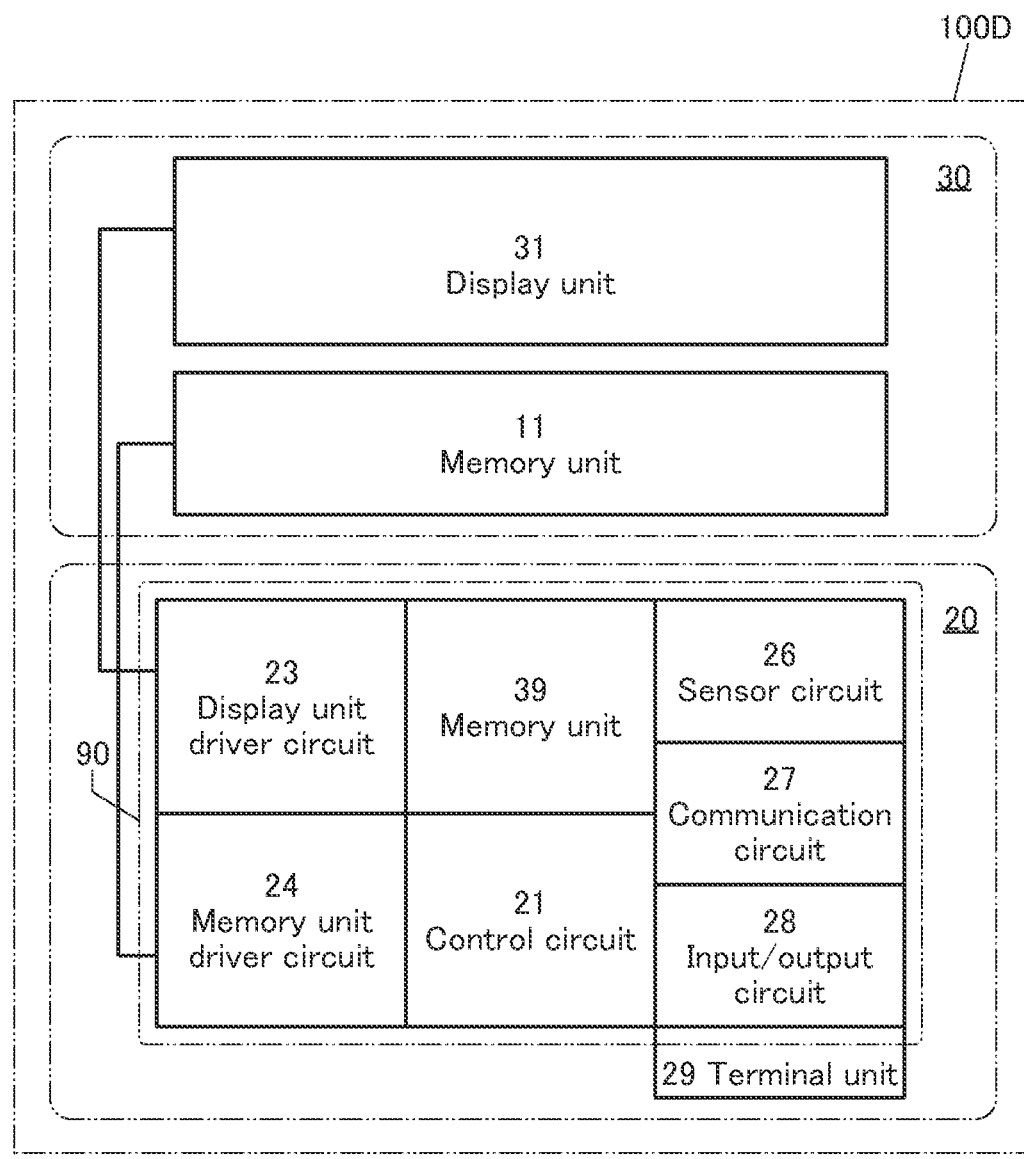
FIG. 19 is a diagram illustrating a structure example of a display apparatus.

FIG. 19 is a block diagram illustrating a structure of a display apparatus 100D of one embodiment of the present invention. The display apparatus 100D has a structure in which a memory unit 39 is added to the layer 20 in the structure of the display apparatus 100A described in Embodiment 1 above.

The memory unit 39 included in the layer 20 includes a memory cell including a Si transistor. For example, the memory unit 39 includes a memory cell such as an SRAM. That is, the display apparatus 100D includes the memory unit 39 provided in the layer 20 with a Si transistor, in addition to the memory unit 11 provided in the layer 30 with an OS transistor described in Embodiment 1 above.

With this structure, the memory unit 11 and the memory unit 39 can be used to each function as a frame memory, by being switched from one another. For example, image data displayed at a high frame frequency is stored in the memory unit 39 including an SRAM, and image data displayed at a low frame frequency is stored in the memory unit 11 including a memory cell with an OS transistor.

Figure 20A:
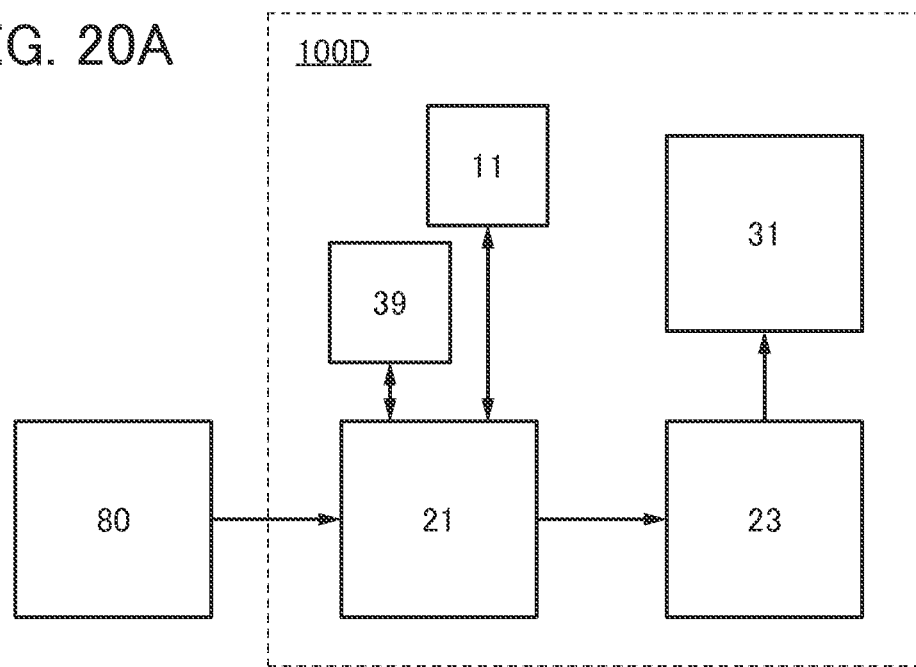
FIG. 20A and FIG. 20B are diagrams each illustrating a structure example of a display apparatus.

FIG. 20A is a block diagram for illustrating a structure of the memory unit 11 and the memory unit 39 that can each be used as a frame memory. FIG. 20A illustrates the external circuit 80 that processes image data, such as a CPU or a GPU, the control circuit 21, the memory unit 11, the memory unit 39, the display unit driver circuit 23, and the display unit 31.

As described above, in the structure of one embodiment of the present invention, the image data output from the external circuit 80 can be sorted and stored in the memory unit 39 or the memory unit 11 at the control circuit 21, in accordance with the frame frequency. Thus, display with the display apparatus 100D which involves the advantage of the memory unit 39 which can increase the speed of read and write of the image data, in addition to the advantage of increased frame memory capacity brought by the provision of the memory unit 11 becomes possible.

Figure 20B:
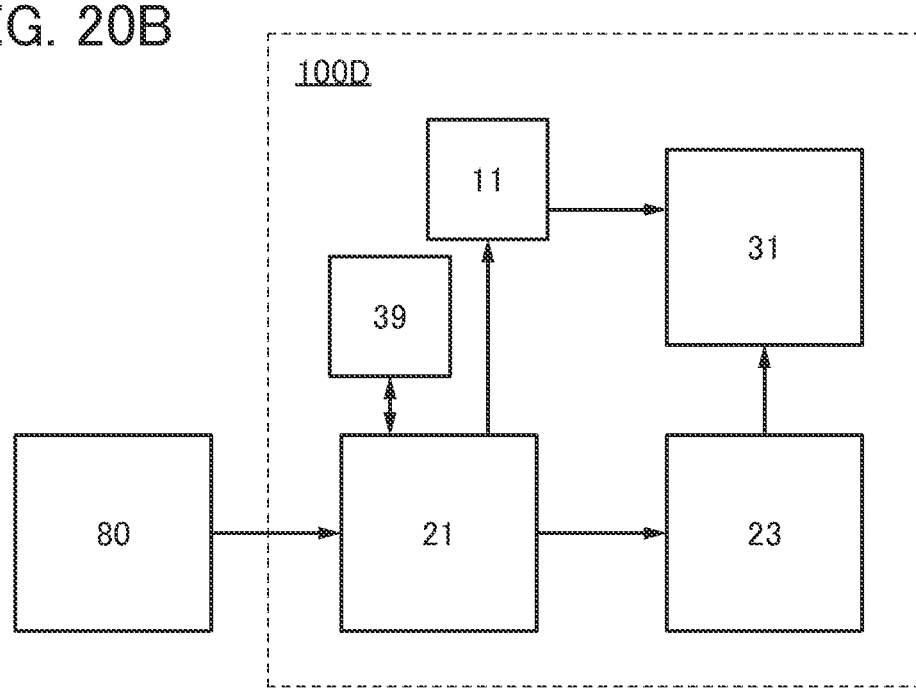

As described in the above embodiment, the memory cell using an OS transistor can retain an analog value. Thus, with the structure where analog data supplied to the pixel circuit is retained as data retained in the memory cell, image data can be supplied directly from the memory unit 11 to the display unit 31. An example of a block diagram in that case is shown in FIG. 20B.

In this way, with the memory unit 11 functioning as a frame memory that retains an analog value, the process for converting digital-value image data into analog-value image data performed in the display unit driver circuit 23 can be omitted. Thus, the circuit scale in the display unit driver circuit 23 can be reduced. Moreover, with the memory unit 39, the speed of write and read of image data can be increased.

At least part of any of the structure examples, the drawings corresponding thereto, and the like described in this embodiment can be implemented in combination with any of the other structure examples, the other drawings corresponding thereto, and the like as appropriate.

Embodiment 3

In this embodiment, a structure example of a display module in which the display apparatus of one embodiment of the present invention can be used will be described.

The display apparatus of this embodiment can be a high-resolution display panel. For example, the display apparatus of one embodiment of the invention can be used for display units of information terminals (wearable devices) such as watch-type and bracelet-type information terminals and display units of wearable devices capable of being worn on a head, such as a VR device like a head-mounted display and a glasses-type AR device.

[Display Module]

Figure 21A:
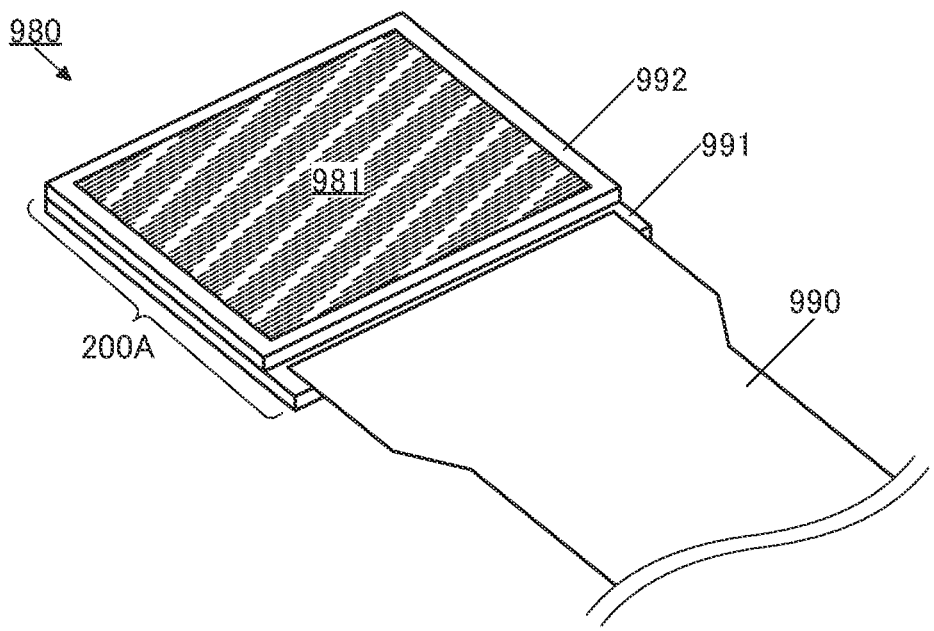
FIG. 21A and FIG. 21B are diagrams each illustrating a structure example of a display apparatus.

FIG. 21A is a perspective view of a display module 980. The display module 980 includes a display apparatus 200A and an FPC 990. Note that the display panel included in the display module 980 is not limited to the display apparatus 200A and may be a display apparatus 200B described later.

The display module 980 includes a substrate 991 and a substrate 992. The display module 980 includes a display unit 981. The display unit 981 is a region where an image is displayed.

Figure 21B:
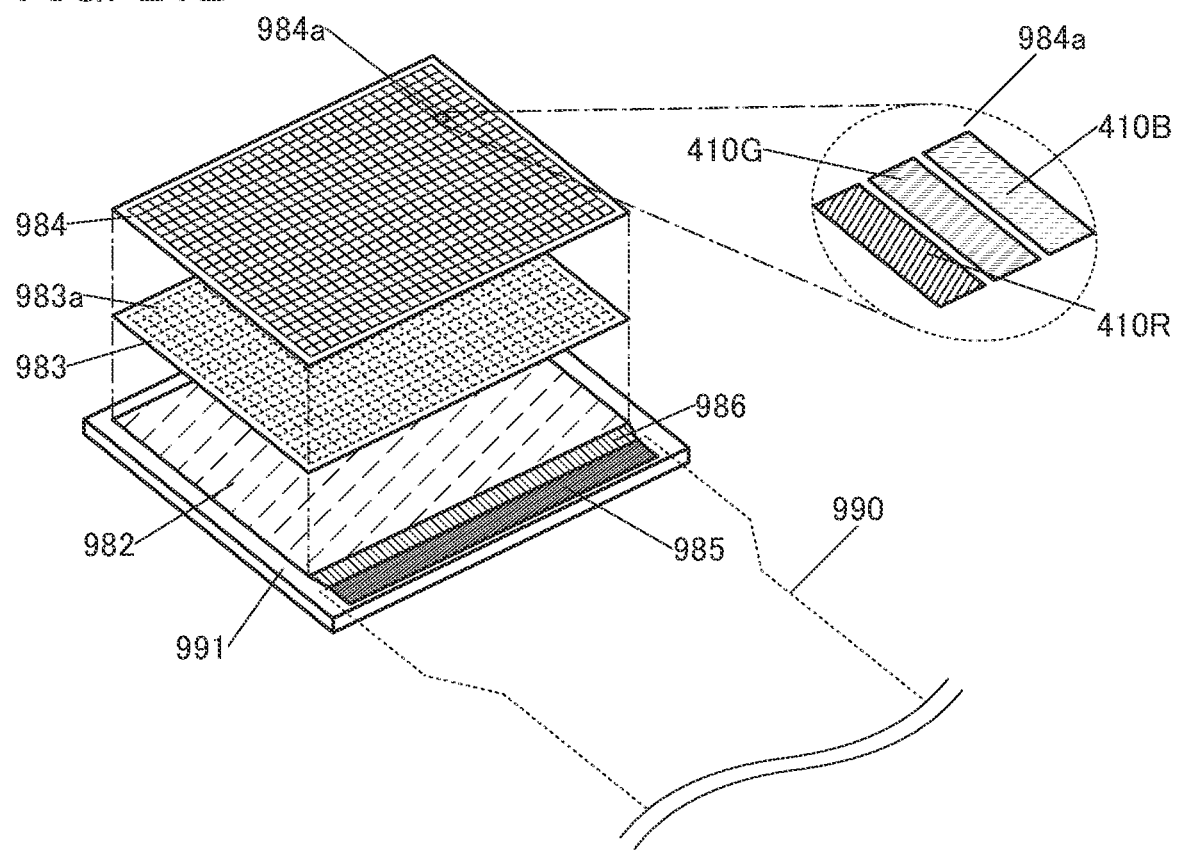

FIG. 21B is a perspective view schematically illustrating a structure on the substrate 991 side. Over the substrate 991, a circuit unit 982, a display unit 983 over the circuit unit 982, and a pixel unit 984 over the display unit 983 are stacked. A terminal unit 985 to be connected to the FPC 990 is provided in a portion over the substrate 991 which does not overlap with the pixel unit 984. The terminal unit 985 and the circuit unit 982 are electrically connected to each other through a wiring unit 986 formed of a plurality of wirings.

For the layer with the circuit unit 982, the circuits with configurations included in the layer 10 which is described above in Embodiment 1 and the like can be used. For the layer included in the display unit 983, a pixel circuit 983a, or the circuit included in the memory unit in the layer 30 which is described above in Embodiment 1 and the like can be used. By increasing layers where elements are provided, the circuits with configurations included in the layer 20 which is described above in Embodiment 1 and the like can be used.

The pixel unit 984 includes a plurality of pixels 984a arranged periodically. An enlarged view of one pixel 984a is illustrated on the right side of FIG. 21B. The pixel 984a includes a light-emitting device 410R that emits red light, a light-emitting device 410G that emits green light, and a light-emitting device 410B that emits blue light.

The display unit 983 includes a plurality of pixel circuits 983a arranged periodically. One pixel circuit 983a is a circuit that controls light emission from three light-emitting devices included in one pixel 984a. As described above in Embodiment 1, a memory unit (not illustrated) can be provided in the layer where the display unit 983 is provided. Alternatively, the pixel circuit 983a can be provided with a memory cell (not illustrated) included in a memory unit in the pixel circuit 983a. One pixel circuit 983a may be provided with three circuits for controlling light emission from the respective light-emitting devices. For example, the pixel circuit 983a for one light-emitting device can include at least one selection transistor, one current control transistor (driving transistor), and a capacitor. In this case, a gate signal is input to a gate of the selection transistor, and a source signal is input to a source of the selection transistor. With such a structure, an active-matrix display panel is achieved.

The circuit unit 982 includes a circuit for driving the pixel circuits 983a in the display unit 983. For example, the circuit unit 982 preferably includes one or both of a gate line driver circuit and a source line driver circuit. In addition, at least one of an arithmetic circuit, a memory circuit, a power supply circuit, and the like may be included. A transistor included in the circuit unit 982 may constitute part of the pixel circuit 983a. That is, the pixel circuit 983a may be composed of a transistor included in the display unit 983 and a transistor included in the circuit unit 982.

The FPC 990 functions as a wiring for supplying a video signal, a power supply potential, or the like to the circuit unit 982 from the outside. An IC may be mounted on the FPC 990.

The display module 980 can have a structure in which a layer with the display unit 983 and a layer with the circuit unit 982 are stacked below the pixel unit 984; thus, the aperture ratio (the effective display area ratio) of the display unit 981 can be significantly high. For example, the aperture ratio of the display unit 981 can be higher than or equal to 40% and lower than 100%, preferably higher than or equal to 50% and lower than or equal to 95%, further preferably higher than or equal to 60% and lower than or equal to 95%. Furthermore, the pixels 984a can be arranged extremely densely and thus the display unit 981 can have extremely high resolution. For example, the pixels 984a are preferably arranged in the display unit 981 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 980 has extremely high resolution, and thus can be suitably used for a device for VR such as a head-mounted display or a glasses-type device for AR. For example, even with a structure in which the display unit of the display module 980 is seen through a lens, pixels of the extremely-high-resolution display unit 981 included in the display module 980 are prevented from being perceived when the display unit is enlarged by the lens, so that display providing a high sense of immersion can be performed. Without being limited thereto, the display module 980 can be suitably used for electronic devices including a relatively small display unit. For example, the display module 980 can be favorably used for a display unit of a wearable electronic device, such as a wrist watch.

[Display Apparatus 200A]

Figure 22:
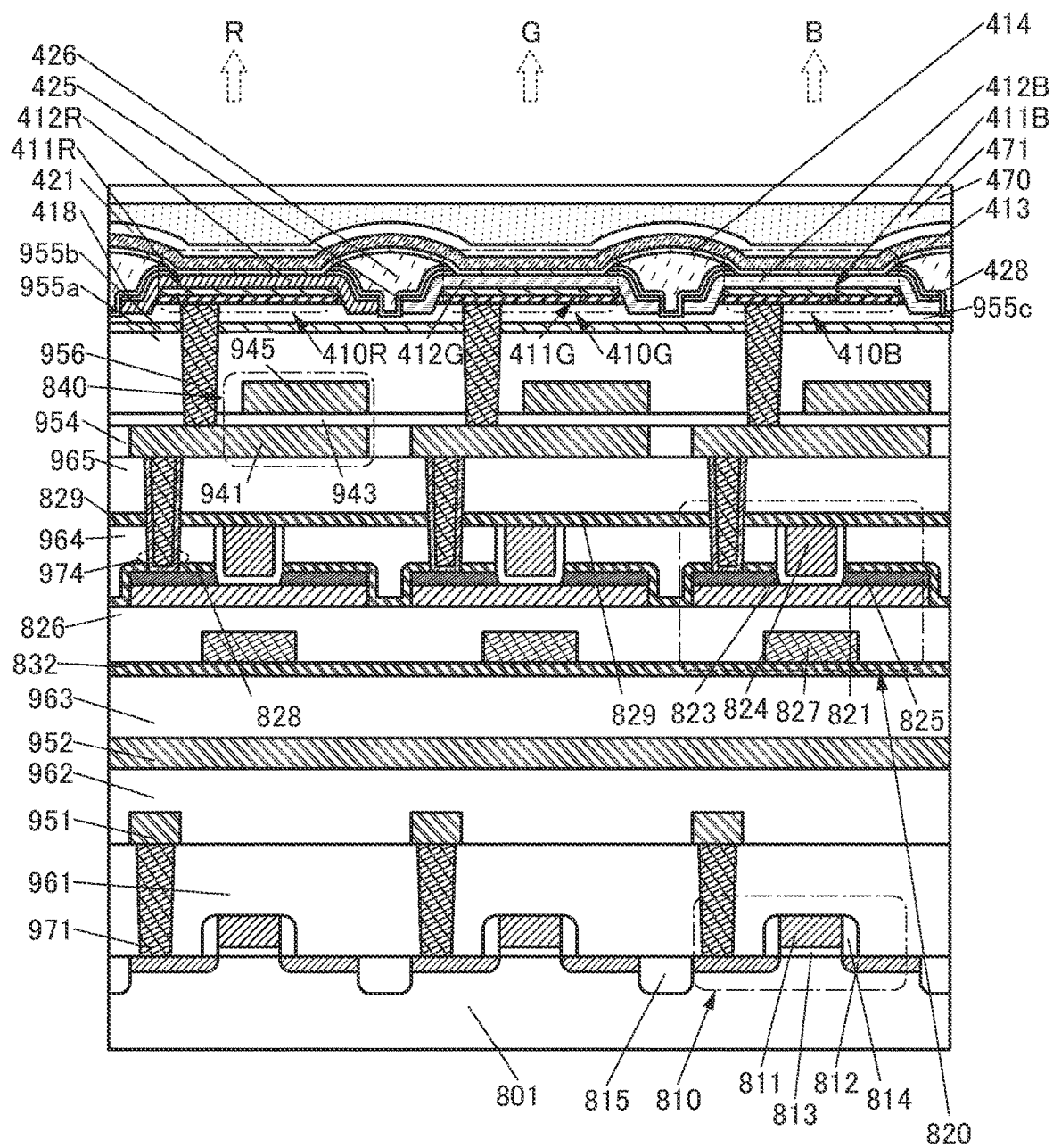
FIG. 22 is a diagram illustrating a structure example of a display apparatus.

The display apparatus 200A illustrated in FIG. 22 has a structure in which a transistor 810 whose channel is formed in a substrate 801 and a transistor 820 including a metal oxide in the semiconductor layer where the channel is formed are stacked.

The substrate 801 corresponds to the substrate 991 in FIG. 21A and FIG. 21B.

The transistor 810 is a transistor including a channel formation region in the substrate 801. As the substrate 801, a semiconductor substrate such as a single crystal silicon substrate can be used, for example. The transistor 810 includes part of the substrate 801, a conductive layer 811, low-resistance regions 812, an insulating layer 813, and an insulating layer 814. The conductive layer 811 functions as a gate electrode. The insulating layer 813 is positioned between the substrate 801 and the conductive layer 811 and functions as a gate insulating layer. The low-resistance region 812 is a region where the substrate 801 is doped with an impurity, and functions as one of a source and a drain. The insulating layer 814 is provided to cover the side surface of the conductive layer 811.

An element isolation layer 815 is provided between two adjacent transistors 810 to be embedded in the substrate 801.

An insulating layer 961 is provided to cover the transistor 810, and a conductive layer 951 is provided over the insulating layer 961. An insulating layer 962 is provided to cover the conductive layer 951, and a conductive layer 952 is provided over the insulating layer 962. The conductive layer 951 and the conductive layer 952 each function as a wiring. An insulating layer 963 and an insulating layer 832 are provided to cover the conductive layer 952, and the transistor 820 is provided over the insulating layer 832.

A transistor 820 is a transistor (OS transistor) that includes a metal oxide (also referred to as an oxide semiconductor) in its semiconductor layer where a channel is formed.

The transistor 820 includes a semiconductor layer 821, an insulating layer 823, a conductive layer 824, a pair of conductive layers 825, an insulating layer 826, and a conductive layer 827.

An insulating layer 832 is provided over the insulating layer 963. The insulating layer 832 functions as a barrier layer that prevents diffusion of impurities such as water or hydrogen from an insulating layer 963 into the transistor 820 and release of oxygen from the semiconductor layer 821 to the insulating layer 832 side. As the insulating layer 832, for example, a film in which hydrogen or oxygen is less likely to diffuse than in a silicon oxide film, such as an aluminum oxide film, a hafnium oxide film, or a silicon nitride film, can be used.

The conductive layer 827 is provided over the insulating layer 832, and the insulating layer 826 is provided to cover the conductive layer 827. The conductive layer 827 functions as a first gate electrode of the transistor 820, and part of the insulating layer 826 functions as a first gate insulating layer. An oxide insulating film such as a silicon oxide film is preferably used as at least part of the insulating layer 826 that is in contact with the semiconductor layer 821. The top surface of the insulating layer 826 is preferably planarized.

The semiconductor layer 821 is provided over the insulating layer 826. The semiconductor layer 821 preferably includes a metal oxide film exhibiting semiconductor characteristics (also referred to as an oxide semiconductor). The pair of conductive layers 825 are provided over and in contact with the semiconductor layer 821 and function as a source electrode and a drain electrode.

An insulating layer 828 is provided to cover the top and side surfaces of the pair of conductive layers 825, the side surface of the semiconductor layer 821, and the like, and an insulating layer 964 is provided over the insulating layer 828. The insulating layer 828 functions as a barrier layer that prevents diffusion of impurities such as water and hydrogen from the insulating layer 964 and the like into the semiconductor layer 821 and release of oxygen from the semiconductor layer 821. As the insulating layer 828, an insulating film similar to the insulating layer 832 can be used.

An opening reaching the semiconductor layer 821 is provided in the insulating layer 828 and the insulating layer 964. The insulating layer 823, which is in contact with the top surface of the semiconductor layer 821, and the conductive layer 824 are embedded in the opening. The conductive layer 824 functions as a second gate electrode, and the insulating layer 823 functions as a second gate insulating layer.

The top surface of the conductive layer 824, the top surface of the insulating layer 823, and the top surface of the insulating layer 964 are planarized so as to be level or substantially level with each other, and an insulating layer 829 and an insulating layer 965 are provided to cover these layers.

The insulating layer 964 and the insulating layer 965 each function as an interlayer insulating layer. The insulating layer 829 functions as a barrier layer that prevents diffusion of impurities such as water and hydrogen from the insulating layer 965 or the like into the transistor 820. As the insulating layer 829, an insulating film similar to the insulating layer 828 and the insulating layer 832 can be used.

A plug 974 electrically connected to one of the pair of conductive layers 825 is provided to be embedded in the insulating layer 965, the insulating layer 829, and the insulating layer 964. Here, the plug 974 preferably has a structure where the side surface of the opening in the insulating layer 965, the insulating layer 829, the insulating layer 964, and the insulating layer 828 and part of the top surface of the conductive layer 825 are covered with a conductive layer. In this case, a conductive material through which hydrogen and oxygen are less likely to diffuse is preferably used for the conductive layer covering the plug 974.

A capacitor 840 is provided over the insulating layer 965. The capacitor 840 and the transistor 820 are electrically connected to each other through the plug 974.

The transistor 820 can be used as a transistor included in the pixel circuit. The transistor 810 can be used as a transistor included in the pixel circuit or a transistor included in a driver circuit for driving the pixel circuit (a gate line driver circuit or a source line driver circuit). The transistor 810 and the transistor 820 can also be used as transistors included in a variety of circuits such as memory cells.

The capacitor 840 includes a conductive layer 941, a conductive layer 945, and an insulating layer 943 positioned therebetween. The conductive layer 941 functions as one electrode of the capacitor 840, the conductive layer 945 functions as the other electrode of the capacitor 840, and the insulating layer 943 functions as a dielectric of the capacitor 840.

The conductive layer 941 is provided over the insulating layer 965 and is embedded in an insulating layer 954. The conductive layer 941 is electrically connected to one of the source and the drain of the transistor 820 through the plug 974 embedded in the insulating layer 965. The insulating layer 943 is provided to cover the conductive layer 941. The conductive layer 945 is provided in a region overlapping with the conductive layer 941 with the insulating layer 943 therebetween.

An insulating layer 955a is provided to cover the capacitor 840, an insulating layer 955b is provided over the insulating layer 955a, and an insulating layer 955c is provided over the insulating layer 955b.

An inorganic insulating film can be suitably used as each of the insulating layer 955a, the insulating layer 955b, and the insulating layer 955c. For example, it is preferable that a silicon oxide film be used as the insulating layer 955a and the insulating layer 955c and a silicon nitride film be used as the insulating layer 955b. This enables the insulating layer 955b to function as an etching protective film. Although this embodiment describes an example in which part of the insulating layer 955c is etched and a depressed portion is formed, a depressed portion is not necessarily provided in the insulating layer 955c.

The light-emitting device 410R, the light-emitting device 410G, and the light-emitting device 410B are provided over the insulating layer 955c.

In the display apparatus 200A, since the light-emitting devices of different emission colors are separately formed, the difference between the chromaticity at low luminance emission and that at high luminance emission is small. Furthermore, since organic layers 412R, 412G, and 412B are separated from each other, crosstalk generated between adjacent subpixels can be suppressed while the display panel has high resolution. Accordingly, the display panel can have high resolution and high display quality.

In regions between adjacent light-emitting devices, an insulating layer 425, a resin layer 426, and a layer 428 are provided.

A pixel electrode 411R, a pixel electrode 411G, and a pixel electrode 411B of the light-emitting device are each electrically connected to one of the source and the drain of the transistor 810 through a plug 956 embedded in the insulating layer 955a, the insulating layer 955b, and the insulating layer 955c, the conductive layer 941 embedded in the insulating layer 954, and a plug 971 embedded in the insulating layer 961. The top surface of the insulating layer 955c and the top surface of the plug 956 are level or substantially level with each other. A variety of conductive materials can be used for the plugs.

A protective layer 421 is provided over the light-emitting devices 410R, 410G, and 410B. A substrate 470 is bonded to the protective layer 421 with an adhesive layer 471.

An insulating layer covering the end portion of the top surface of the pixel electrode 411 is not provided between two adjacent pixel electrodes 411. Thus, the distance between adjacent light-emitting devices can be extremely shortened. Accordingly, the display apparatus can have high resolution or high definition.

With such a structure, not only the pixel circuit but also the driver circuit and the like can be formed directly under the light-emitting devices; thus, the display panel can be downsized as compared with the case where a driver circuit is provided around a display region.

[Display Apparatus 200B]

Figure 23:
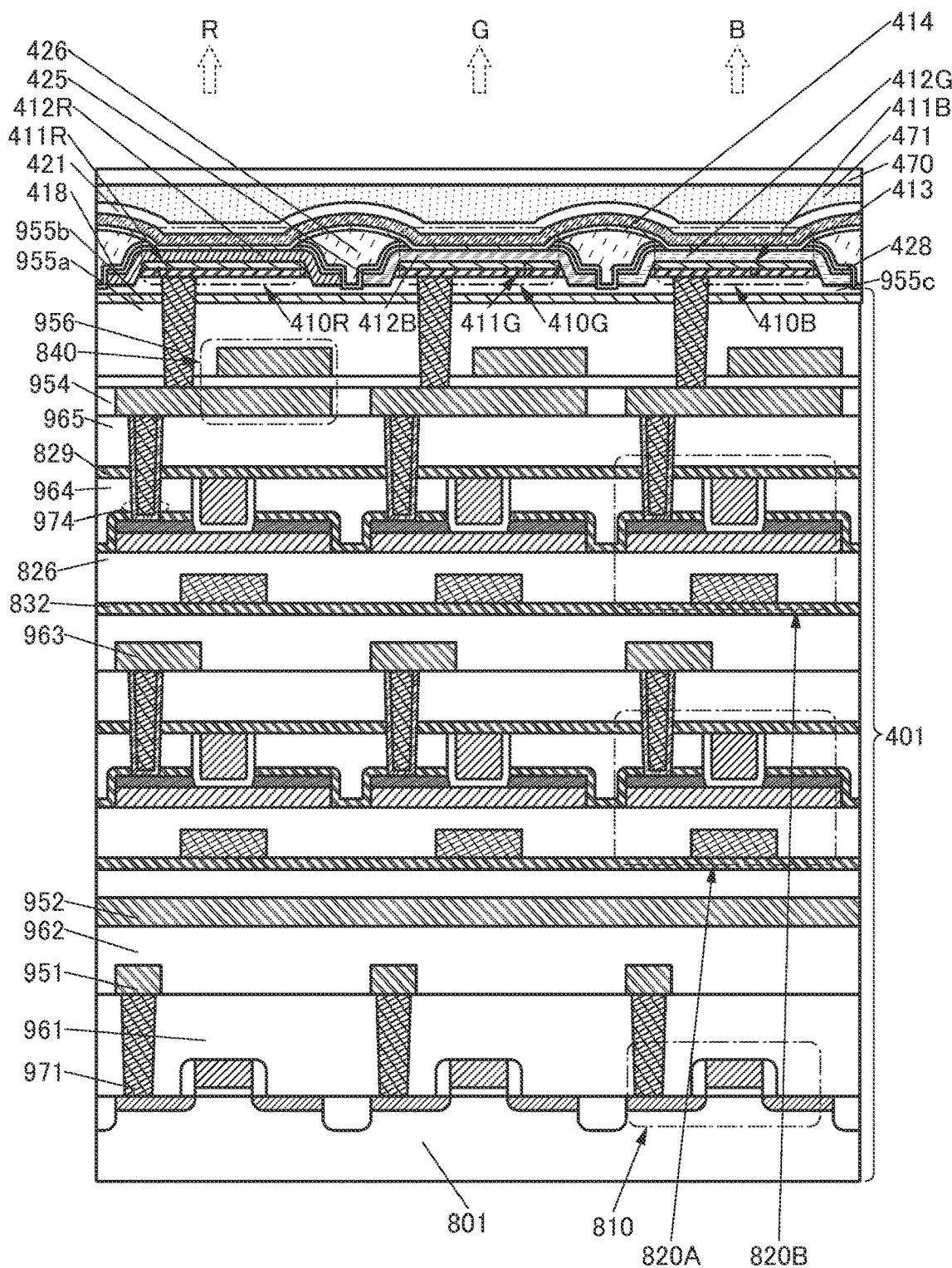
FIG. 23 is a diagram illustrating a structure example of a display apparatus.

The display apparatus 200B illustrated in FIG. 23 has a structure in which a transistor 820A including a metal oxide in the semiconductor layer where the channel is formed and a transistor 820B including a metal oxide in the semiconductor layer where the channel is formed are stacked. With this structure, transistors that are different in composition of constituent elements in the metal oxide in the semiconductor layer can be used. Thus, a display apparatus using OS transistors with different transistor characteristics can be achieved. For example, the transistor 820A in the upper layer is used as a transistor of a pixel circuit for driving a light-emitting device, and the transistor 820B in the lower layer can be used as a transistor of a memory cell.

With such a structure, circuits provided directly under the light-emitting devices can be placed at higher density; thus, the display panel can be downsized as compared with the case where a driver circuit is provided around a display region.

At least part of this embodiment can be implemented in combination with the other embodiments described in this specification as appropriate.

Embodiment 4

In this embodiment, examples of an electronic device in which the display apparatus according to one embodiment of the present invention can be employed will be described.

The display apparatus of one embodiment of the present invention can be used in a display unit of an electronic device. Thus, an electronic device with high display quality can be obtained. An electronic device with an extremely high resolution can be obtained. A highly reliable electronic device can be obtained.

Examples of electronic devices including the display apparatus or the like of one embodiment of the present invention include display apparatuses of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, car phones, cellular phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Other examples include industrial equipment such as guide lights, traffic lights, conveyor belts, elevators, escalators, industrial robots, power storage systems, and power storage devices for leveling the amount of power supply and smart grid. In addition, moving objects and the like driven by fuel engines or electric motors using power from power memory units may also be included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and it is preferable that the secondary battery be capable of being charged by contactless power transmission.

Examples of the secondary battery include a lithium ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display images, information, and the like on a display unit. When the electronic device includes the antenna and a secondary battery, the antenna may be used for contactless power transmission.

The electronic device of one embodiment of the present invention may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of information (a still image, a moving image, a text image, and the like) on the display unit, a touch panel function, a function of displaying a calendar, date, time, and the like, a function of executing a variety of software (programs), a wireless communication function, and a function of reading out a program or data stored in a recording medium.

Furthermore, an electronic device including a plurality of display units can have a function of displaying image information mainly on one display unit while displaying text information mainly on another display unit, a function of displaying a three-dimensional image by displaying images on the plurality of display units with a parallax taken into account, or the like. Furthermore, an electronic device including an image receiving unit can have a function of taking a still image or a moving image, a function of automatically or manually correcting a taken image, a function of storing a taken image in a recording medium (an external recording medium or a recording medium incorporated in the electronic device), a function of displaying a taken image on a display unit, or the like. Note that functions of the electronic device of one embodiment of the present invention are not limited thereto, and the electronic devices can have a variety of functions.

The display apparatus of one embodiment of the present invention can display high-resolution images. For this reason, the display apparatus can be used particularly for portable electronic apparatuses, wearable electronic apparatuses, e-book readers, and the like. For example, the semiconductor device can be suitably used for xR devices such as a VR device and an AR device.

Figure 24A:
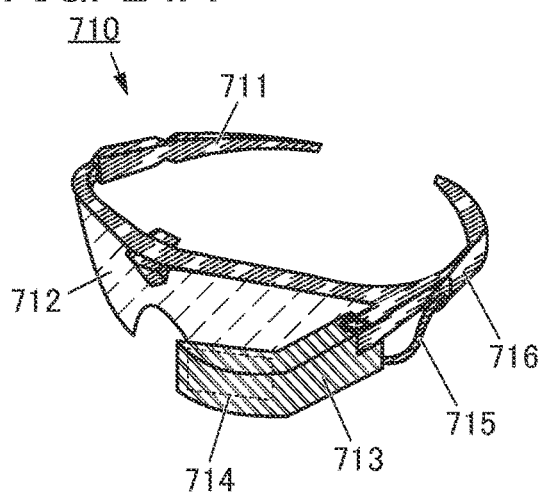
FIG. 24A to FIG. 24E are diagrams each illustrating an example of an electronic device.

FIG. 24A illustrates an appearance of a head-mounted display 710. The head-mounted display 710 includes a mounting portion 711, a lens 712, a main body 713, a display unit 714, a cable 715, and the like. A battery 716 is incorporated in the mounting portion 711. The display apparatus of one embodiment of the present invention can be used in the display unit 714.

The cable 715 supplies electric power from the battery 716 to the main body 713. The main body 713 includes a wireless receiver or the like and can display received image information, such as image data, on the display unit 714. The movement of the eyeball and/or the eyelid of a user is captured by a camera provided in the main body 713 and then the sight line of the user is calculated using the information to utilize the sight line of the user as an input means.

A plurality of electrodes may be provided in the mounting portion 711 at positions in contact with the user. The main body 713 may have a function of recognizing the user's sight line by sensing current flowing through the electrodes in accordance with the movement of the user's eyeball. Alternatively, the main body 713 may have a function of sensing current flowing through the electrodes to monitor the user's pulse. The mounting portion 711 may include various sensors such as a temperature sensor, a pressure sensor, and an acceleration sensor and may have a function of displaying the user's biological information on the display unit 714. The main body 713 may sense the movement of the user's head or the like to change an image displayed on the display unit 714 in synchronization with the movement.

Figure 24B:
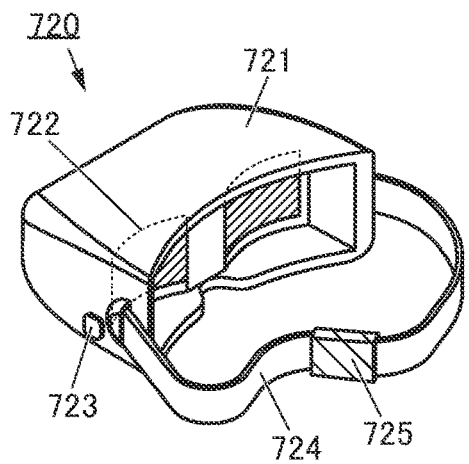

FIG. 24B illustrates an appearance of a head-mounted display 720. The head-mounted display 720 is a goggles-type information processing device.

The head-mounted display 720 includes a housing 721, an operation button 723, a fixing band 724, and two display units 722. Since the head-mounted display 720 includes the two display units 722, the user's eyes can see their respective display units. Thus, a high-resolution image can be displayed even when a three-dimensional display using parallax or the like is performed. A battery 725 is provided for the fixing band 724. The battery 725 may be provided in the housing 721. However, the battery is preferably provided for the fixing band 724, whereby the center of gravity of the head-mounted display 720 is placed in the rear part and thus the user's feeling of wearing is enhanced. Note that besides the battery 725 a driver circuit or the like for driving the display unit 722 may be provided for the fixing band 724 so that the center of gravity of the head-mounted display 720 can be adjusted.

The operation button 723 has a function of a power button or the like. A button other than the operation button 723 may be included.

The display apparatus of one embodiment of the present invention can be used in the display unit 722. The display apparatus of one embodiment of the present invention has an extremely high resolution; thus, the pixels are less likely to be perceived by a user and a more realistic image can be displayed.

Figure 24C:
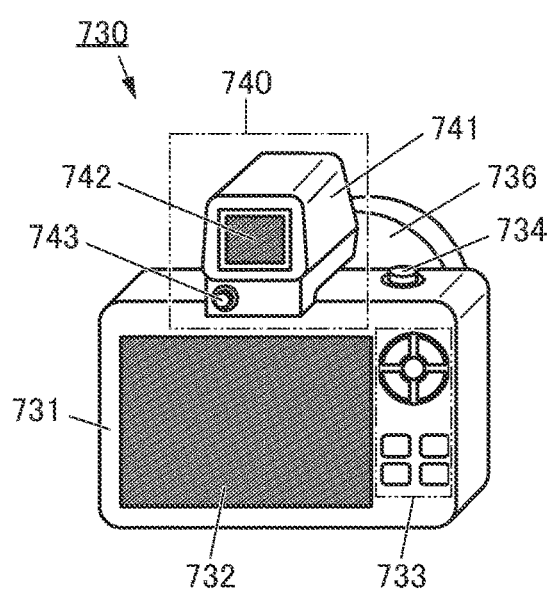

FIG. 24C illustrates an appearance of a camera 730 equipped with a finder 740.

The camera 730 includes a housing 731, a display unit 732, operation buttons 733, a shutter button 734, and the like. Moreover, a detachable lens 736 is attached to the camera 730.

Although the lens 736 of the camera 730 here is detachable from the housing 731 for replacement, the lens 736 may be integrated with the housing.

The camera 730 can take images at the press of the shutter button 734. In addition, the display unit 732 has a function of a touch panel, and images can also be taken by touch on the display unit 732.

The housing 731 of the camera 730 includes a mount including an electrode, so that the finder 740, a stroboscope, or the like can be connected to the housing.

The finder 740 includes a housing 741, a display unit 742, a button 743, and the like.

The housing 741 includes a mount for engagement with the mount of the camera 730 so that the finder 740 can be attached to the camera 730. The mount includes an electrode, and an image or the like received from the camera 730 through the electrode can be displayed on the display unit 742.

The button 743 functions as a power button. The on/off state of the display unit 742 can be switched with the button 743.

The display apparatus of one embodiment of the present invention can be used in the display unit 732 of the camera 730 and the display unit 742 of the finder 740.

Although the camera 730 and the finder 740 are separate and detachable electronic devices in FIG. 24C, a finder including the display apparatus of one embodiment of the present invention may be built into the housing 731 of the camera 730.

Figure 24D:
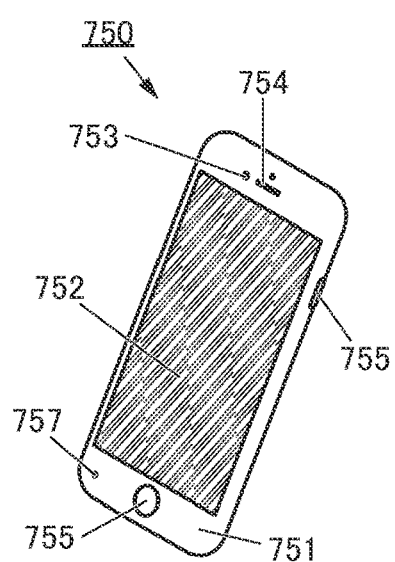

An information terminal 750 illustrated in FIG. 24D includes a housing 751, a display unit 752, a microphone 757, a speaker portion 754, a camera 753, operation switches 755, and the like. The display apparatus of one embodiment of the present invention can be used in the display unit 752. The display unit 752 functions as a touch panel. The information terminal 750 also includes an antenna, a battery, and the like inside the housing 751. The information terminal 750 can be used as, for example, a smartphone, a mobile phone, a tablet information terminal, a tablet personal computer, an e-book reader, or the like.

Figure 24E:
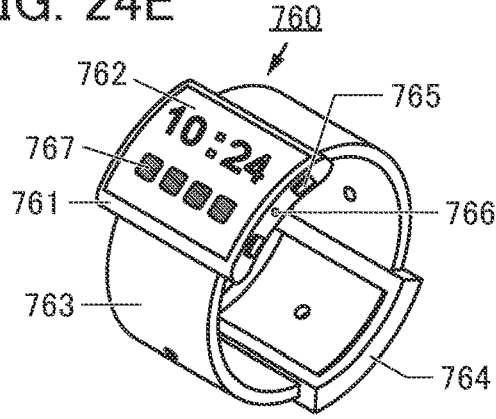

FIG. 24E illustrates an example of a watch-type information terminal. An information terminal 760 includes a housing 761, a display unit 762, a band 763, a buckle 764, an operation switch 765, an input/output terminal 766, and the like. In addition, the information terminal 760 includes an antenna, a battery, and the like inside the housing 761. The information terminal 760 is capable of executing a variety of applications such as mobile phone calls, e-mailing, text viewing and editing, music reproduction, Internet communication, and computer games.

In addition, the display unit 762 includes a touch sensor, and operation can be performed by touching the screen with a finger, a stylus, or the like. For example, with a touch on an icon 767 displayed on the display unit 762, an application can be started. With the operation switch 765, a variety of functions such as time setting, power on/off, on/off of wireless communication, setting and cancellation of a silent mode, and setting and cancellation of a power saving mode can be performed. For example, the functions of the operation switch 765 can be set by the operating system incorporated in the information terminal 760.

The information terminal 760 can execute near field communication conformable to a communication standard. For example, mutual communication between the information terminal 760 and a headset capable of wireless communication enables hands-free calling. The information terminal 760 includes an input/output terminal 766, and can perform data transmission and reception with another information terminal through the input/output terminal 766. In addition, charging can be performed via the input/output terminal 766. Note that the charging operation may be performed by wireless power feeding without using the input/output terminal 766.

The electronic devices illustrated in FIG. 24A to FIG. 24E, in which the display apparatus of one embodiment of the present invention can be used, may be connected to an external server through a network. Furthermore, processing that requires high arithmetic capability may be performed in a server connected through a network, instead of being performed inside the electronic device. Such processing is also referred to as "thin client"; only limited processing is performed in a terminal (here, an electronic device) on a user side (client side), and high-level processing such as execution and control of an application is performed on a server side, whereby the scale of processing of the terminal on the client side can be reduced. Thus, the use of an arithmetic device with high arithmetic performance in the electronic device is unnecessary, which facilitates reduction in cost, weight, and size. Furthermore, in the electronic device of one embodiment of the present invention, the above-described thin client and processing that requires high arithmetic capability on the electronic device side may be combined for processing.

The structures described in this embodiment can be used in an appropriate combination with the structures described in the other embodiments and the like.

SUPPLEMENTARY NOTES ON DESCRIPTION IN THIS SPECIFICATION AND THE LIKE

The following are notes on the description of the foregoing embodiments and the structures in the embodiments.

The structure described in each embodiment can be combined with any of the structures described in the other embodiments as appropriate to constitute one embodiment of the present invention. In addition, in the case where a plurality of structure examples are described in one embodiment, some of the structure examples can be combined as appropriate.

Note that a content (or part thereof) described in one embodiment can be applied to, combined with, or replaced with another content (or part thereof) in the same embodiment or a content (or part thereof) described in another embodiment or other embodiments, for example.

Note that in each embodiment, a content described in the embodiment is a content described with reference to a variety of diagrams or a content described with text disclosed in the specification.

Note that by combining a diagram (or part thereof) described in one embodiment with another part of the diagram, a different diagram (or part thereof) described in the embodiment, or a diagram (or part thereof) described in another embodiment or other embodiments, much more diagrams can be formed.

In this specification and the like, components are classified on the basis of the functions, and shown as blocks independent of one another in block diagrams. However, in an actual circuit and the like, such components are sometimes hard to classify functionally, and there is a case where one circuit is associated with a plurality of functions and a case where a plurality of circuits are associated with one function. Therefore, the blocks in the block diagrams are not limited by the components described in the specification, and the description can be changed appropriately depending on the situation.

Furthermore, in the drawings, the size, the layer thickness, or the region is shown with given magnitude for description convenience. Therefore, they are not limited to the illustrated scale. Note that the drawings are schematically shown for clarity, and embodiments of the present invention are not limited to shapes, values, or the like shown in the drawings. For example, variation in signal, voltage, or current due to noise, variation in signal, voltage, or current due to difference in timing, or the like can be included.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the terms such as "electrode" and "wiring" do not limit the functions of the components. For example, an "electrode" is used as part of a "wiring" in some cases, and vice versa. Furthermore, the terms such as "electrode" and "wiring" also include the case where a plurality of "electrodes" and "wirings" are formed in an integrated manner, for example.

In this specification and the like, voltage and potential can be replaced with each other as appropriate. The term voltage refers to a potential difference from a reference potential, and when the reference potential is a ground potential, for example, voltage can be replaced with potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Also, for example, the term "insulating film" can be changed into the term "insulating layer" in some cases.

In this specification and the like, a switch is in a conduction state (on state) or in a non-conduction state (off state) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap with each other or a region where a channel is formed.

In this specification and the like, the expression "A and B are connected" means the case where A and B are electrically connected to each other as well as the case where A and B are directly connected to each other. Here, the expression "A and B are electrically connected" means the case where electric signals can be transmitted and received between A and B when an object having any electric action exists between A and B.

In this specification and the like, a device fabricated using a metal mask or an FMM (fine metal mask) is sometimes referred to as a device having an MM (metal mask) structure. In addition, in this specification and the like, a device fabricated without using a metal mask or an FMM is sometimes referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more light-emitting layers are selected so that a white color can be produced by light emission of the light-emitting layers. For example, when the emission color of a first light-emitting layer and the emission color of a second light-emitting layer are complementary colors, the light-emitting device can be configured to emit white light as a whole. To obtain white light emission by using three or more light-emitting layers, the light-emitting device is configured to emit white light as a whole by combining emission colors of the three or more light-emitting layers.

A device having a tandem structure includes two or more light-emitting units between a pair of electrodes, and each light-emitting unit preferably includes one or more light-emitting layers. To obtain white light emission, the structure is made such that light from light-emitting layers of the plurality of light-emitting units can be combined to be white light. Note that a structure for obtaining white light emission is similar to that in the case of a single structure. Note that in the device having a tandem structure, an intermediate layer such as a charge-generation layer is suitably provided between the plurality of light-emitting units.

When the white-light-emitting device (with a single structure or a tandem structure) and a light-emitting device with an SBS structure are compared to each other, the light-emitting device with an SBS structure can have lower power consumption than the white-light-emitting device. To reduce power consumption, a light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

REFERENCE NUMERALS

10: layer, 11: memory unit, 12: memory cell, 20: layer, 21: control circuit, 23: display unit driver circuit, 24: memory unit driver circuit, 26: sensor circuit, 27: communication circuit, 28: input/output circuit, 29: terminal unit, 30: layer, 31: display unit, 40: sealing substrate, 50: pixel, 100A: display apparatus

The invention claimed is:

1. A display apparatus comprising:
a first layer;
a second layer over the first layer; and
a third layer over the second layer,
wherein the first layer comprises a functional circuit,
wherein the second layer comprises a display unit comprising a plurality of pixels,
wherein the third layer comprises a memory unit comprising a plurality of memory cells,
wherein each of the plurality of pixels comprises a pixel circuit and a light-emitting element over the pixel circuit,
wherein the functional circuit comprises a display unit driver circuit, and
wherein the memory unit is configured to store image data that is to be output through the display unit driver circuit to the display unit.

2. The display apparatus according to claim 1,
wherein one of the plurality of memory cells comprises:
a first transistor configured to retain a potential corresponding to the image data; and
a second transistor configured to read the potential,
wherein the first transistor is provided in the third layer, and
wherein the second transistor is provided in the first layer.

3. The display apparatus according to claim 2,
wherein a semiconductor layer comprising a channel formation region of the first transistor comprises a metal oxide, and
wherein a semiconductor layer comprising a channel formation region of the second transistor comprises silicon.

4. The display apparatus according to claim 1,
wherein the display unit driver circuit is provided in a region overlapping with the display unit.

5. The display apparatus according to claim 1,
wherein the functional circuit comprises a control circuit, a sensor circuit, a communication circuit, and an input/output circuit.

6. A display apparatus comprising:
a first layer; and
a second layer over the first layer,
wherein the first layer comprises:
- a display unit driver circuit;
- a memory unit driver circuit;
- a control circuit; and
- at least one of a sensor circuit, a communication circuit, and an input/output circuit, wherein the second layer comprises:
- a display unit comprising a plurality of pixels; and
- a memory unit comprising a plurality of memory cells, wherein each of the plurality of pixels comprises a pixel circuit and a light-emitting element over the pixel circuit,
wherein the memory unit is configured to store image data that is to be output through the display unit driver circuit to the display unit, and
wherein the display unit driver circuit, the memory unit driver circuit, the control circuit, and the one of the sensor circuit, the communication circuit, and the input/output circuit overlaps with the display unit.

7. The display apparatus according to claim 6,
wherein one of the plurality of memory cells comprises:
- a first transistor configured to retain a potential corresponding to the image data; and
- a second transistor configured to read the potential,
wherein the first transistor is provided in the second layer, and
wherein the second transistor is provided in the first layer.

8. The display apparatus according to claim 7,
wherein a semiconductor layer comprising a channel formation region of the first transistor comprises a metal oxide, and
wherein a semiconductor layer comprising a channel formation region of the second transistor comprises silicon.

9. The display apparatus according to claim 6,
wherein, in a top view of the display apparatus, a first memory cell of the plurality of memory cells and a second memory cell of the plurality of memory cells sandwich the display unit.

10. The display apparatus according to claim 6,
wherein the display unit comprises a plurality of sub-display units, and
wherein the number of times of image rewriting of image data per unit time in a first sub-display unit of the plurality of sub-display units is smaller than the number of times of image rewriting of image data per unit time in a second sub-display unit of the plurality of sub-display units.

11. The display apparatus according to claim 6,
wherein one of the plurality of memory cells comprises:
- a first transistor; and
- a second transistor,
wherein the first transistor is provided in the second layer, and
wherein the second transistor is provided in the first layer.

12. The display apparatus according to claim 11,
wherein a semiconductor layer comprising a channel formation region of the first transistor comprises a metal oxide, and
wherein a semiconductor layer comprising a channel formation region of the second transistor comprises silicon.

13. The display apparatus according to claim 8,
wherein the metal oxide comprises indium.

14. The display apparatus according to claim 12,
wherein the metal oxide comprises indium.

* * * * *